US012581826B2

(12) United States Patent
Lee et al.

(10) Patent No.: US 12,581,826 B2
(45) Date of Patent: Mar. 17, 2026

(54) LIGHT-EMITTING DEVICE AND A METHOD OF MANUFACTURING A LIGHT-EMITTING DEVICE IN WHICH MATERIAL IS DEPOSITED ON FIRST AND SECOND AREAS OF A SUBSTRATE

(71) Applicant: Samsung Display Co., LTD., Yongin-si (KR)

(72) Inventors: Kyungjun Lee, Yongin-si (KR); Hwajung Lee, Yongin-si (KR); Sanghyun Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 32 days.

(21) Appl. No.: 18/440,885

(22) Filed: Feb. 13, 2024

(65) Prior Publication Data

US 2024/0206238 A1 Jun. 20, 2024

Related U.S. Application Data

(62) Division of application No. 17/231,637, filed on Apr. 15, 2021, now Pat. No. 11,910,653.

(30) Foreign Application Priority Data

Aug. 5, 2020 (KR) ........................ 10-2020-0098192

(51) Int. Cl.
*H10K 59/35* (2023.01)
*H10K 50/17* (2023.01)
(Continued)

(52) U.S. Cl.
CPC ............. *H10K 59/35* (2023.02); *H10K 50/17* (2023.02); *H10K 59/122* (2023.02);
(Continued)

(58) Field of Classification Search
CPC ...... H10K 59/35; H10K 50/17; H10K 59/122; H10K 59/876; H10K 71/00; H10K 71/164;
(Continued)

(56) References Cited

U.S. PATENT DOCUMENTS 7,400,088 B2 7/2008 Ryu
8,881,676 B2 * 11/2014 Hong ..................... H10K 71/00
118/504
(Continued)

FOREIGN PATENT DOCUMENTS

CN 103915577 A 7/2014
JP 2009-020232 1/2009
(Continued)

OTHER PUBLICATIONS

Non-Final Office Action issued Jan. 12, 2023, in U.S. Appl. No. 17/231,637.
(Continued)

*Primary Examiner* — Caleb E Henry
(74) *Attorney, Agent, or Firm* — CANTOR COLBURN LLP

(57) ABSTRACT

A method of manufacturing a light-emitting device including a body portion and a light-emitting portion arranged in the body portion and configured to emit light to the outside. The light-emitting portion includes a plurality of pixels. At least two of the pixels are configured to emit pieces of light having different wavelengths from each other.

10 Claims, 15 Drawing Sheets

(51) Int. Cl.
| | |
|---|---|
| *H10K 59/122* | (2023.01) |
| *H10K 59/80* | (2023.01) |
| *H10K 71/16* | (2023.01) |

(52) U.S. Cl.
CPC ......... *H10K 59/876* (2023.02); *H10K 71/164* (2023.02); *H10K 71/166* (2023.02)

(58) Field of Classification Search
CPC .......... H10K 71/166; H10K 2102/351; H10K 50/15; H10K 50/156; H10K 71/20; A61N 5/06; A61N 5/00; A61N 2005/063; A61N 2005/0632; A61N 2005/065; A61N 5/0616; A61N 2005/0658; A61N 2005/0663; F21V 23/005; F21V 33/00; C23C 14/12; C23C 14/24; C23C 14/042
See application file for complete search history.

(56) References Cited

U.S. PATENT DOCUMENTS

| | | | |
|---|---|---|---|
| 8,915,213 B2 * | 12/2014 | Park | C23C 14/12 |
| | | | 118/721 |
| 8,946,722 B2 | 2/2015 | Kim et al. | |
| 9,346,078 B2 * | 5/2016 | Oh | B05C 21/005 |
| 9,508,946 B2 | 11/2016 | Song et al. | |
| 9,567,662 B2 * | 2/2017 | Kim | H10K 71/166 |
| 9,644,272 B2 | 5/2017 | Lee et al. | |
| 9,660,191 B2 | 5/2017 | Lee et al. | |
| 9,711,724 B2 * | 7/2017 | Baek | C23C 14/042 |
| 9,935,292 B2 | 4/2018 | Seo et al. | |
| 10,002,910 B2 | 6/2018 | Oh et al. | |
| 10,002,914 B2 | 6/2018 | Kim et al. | |
| 10,128,440 B2 * | 11/2018 | Lee | H10K 71/191 |
| 10,301,715 B2 * | 5/2019 | Yoo | C25D 1/10 |
| 10,396,282 B2 * | 8/2019 | Lee | H10K 71/00 |
| 2004/0020435 A1 * | 2/2004 | Tsuchiya | C23C 14/042 |
| | | | 118/723 VE |
| 2005/0040756 A1 | 2/2005 | Winters | |
| 2007/0159086 A1 | 7/2007 | Yu et al. | |
| 2008/0218070 A1 | 9/2008 | Kobayashi | |
| 2008/0218071 A1 | 9/2008 | Kobayashi | |
| 2009/0015768 A1 | 1/2009 | Igeta et al. | |
| 2010/0052524 A1 | 3/2010 | Kinoshita | |

| | | | |
|---|---|---|---|
| 2011/0073884 A1 | 3/2011 | Lee | |
| 2011/0186820 A1 | 8/2011 | Kim | |
| 2011/0229633 A1 * | 9/2011 | Hong | H10K 71/166 |
| | | | 118/504 |
| 2012/0266813 A1 * | 10/2012 | Hong | H10K 71/166 |
| | | | 118/504 |
| 2013/0001532 A1 | 1/2013 | Hwang et al. | |
| 2013/0320308 A1 | 12/2013 | Lee | |
| 2014/0110682 A1 | 4/2014 | Shih | |
| 2014/0131674 A1 | 5/2014 | Park | |
| 2014/0150721 A1 * | 6/2014 | Oh | C23C 14/042 |
| | | | 118/504 |
| 2014/0183499 A1 | 7/2014 | Kim et al. | |
| 2015/0027367 A1 * | 1/2015 | Hong | C23C 14/044 |
| | | | 118/505 |
| 2015/0028317 A1 * | 1/2015 | Ichihara | H10K 50/858 |
| | | | 257/40 |
| 2015/0039061 A1 | 2/2015 | Hong | |
| 2016/0026089 A1 * | 1/2016 | Chen | G03F 7/20 |
| | | | 118/504 |
| 2018/0040857 A1 * | 2/2018 | Hong | C23C 14/541 |
| 2018/0083193 A1 * | 3/2018 | Kim | H01L 21/67 |
| 2018/0148823 A1 * | 5/2018 | Yoo | C25D 1/10 |
| 2018/0148844 A1 * | 5/2018 | Yoo | B23K 26/244 |
| 2018/0272150 A1 | 9/2018 | Choi et al. | |
| 2018/0358578 A1 | 12/2018 | Li et al. | |
| 2019/0237708 A1 * | 8/2019 | Yi | H10K 71/166 |
| 2019/0368025 A1 * | 12/2019 | Kim | C23C 14/042 |
| 2021/0202852 A1 * | 7/2021 | Lee | C23C 14/042 |
| 2021/0343760 A1 * | 11/2021 | Jo | C23C 14/042 |

FOREIGN PATENT DOCUMENTS

| | | |
|---|---|---|
| KR | 10-0721554 | 5/2007 |
| KR | 1020160011770 A | 2/2016 |
| KR | 1020160123434 A | 10/2016 |
| KR | 10-1792659 | 11/2017 |
| KR | 10-2095377 | 4/2020 |

OTHER PUBLICATIONS

Final Office Action issued Jul. 12, 2023, in U.S. Appl. No. 17/231,637.
Notice of Allowance issued Oct. 20, 2023, in U.S. Appl. No. 17/231,637.

\* cited by examiner

LIGHT-EMITTING DEVICE AND A METHOD OF MANUFACTURING A LIGHT-EMITTING DEVICE IN WHICH MATERIAL IS DEPOSITED ON FIRST AND SECOND AREAS OF A SUBSTRATE

CROSS REFERENCE TO RELATED APPLICATION

This application is a Division of U.S. patent application Ser. No. 17/231,637, filed Apr. 15, 2021, which claims priority from and the benefit of Korean Patent Application No. 10-2020-0098192, filed on Aug. 5, 2020, which is hereby incorporated by reference for all purposes as if fully set forth herein.

BACKGROUND

Field

Exemplary embodiments of the invention relate to a light-emitting device and a method of manufacturing the same.

Discussion of the Background

In recent years, light-emitting devices have been used for skin care using light in the beauty market, or have been used for lesion treatments using light in the medical market. Light-emitting devices may provide an optimized cosmetic or therapeutic effect by emitting light having a certain wavelength to the outside.

A light-emitting device may include a plurality of pixels that emit light having a certain wavelength to the outside. Each of the pixels is made to emit pieces of light having the same wavelength to the outside, so that the light-emitting device may be optimized for one effect.

In general, when a light-emitting device emits light having a certain wavelength to the outside, a cosmetic or therapeutic effect optimized for a single lesion may be provided, but a new light-emitting device has to be used for providing different effects to a user.

The above information disclosed in this Background section is only for understanding of the background of the inventive concepts, and, therefore, it may contain information that does not constitute prior art.

SUMMARY

Exemplary embodiments of the invention provide a light-emitting device for providing pieces of light having various wavelengths, and a method of manufacturing the same.

Additional features of the inventive concepts will be set forth in the description which follows, and in part will be apparent from the description, or may be learned by practice of the inventive concepts.

An exemplary embodiment of the invention provides a light-emitting device including a body portion, and a light-emitting portion arranged in the body portion and configured to emit light to the outside. The light-emitting portion includes a plurality of pixels configured to emit same color, and a pixel defining layer defining an emission area of each of the plurality of pixels. At least two of the plurality of pixels are configured to emit pieces of light having different wavelengths from each other, and an auxiliary layer of an intermediate layer in each of the plurality of pixels is arranged on at least two pixels adjacent to each other among the plurality of pixels and the pixel defining layer between adjacent pixels.

Each of the plurality of pixels may be further configured to emit at least one of white light, red light, green light, and blue light.

Each of the plurality of pixels may include a pixel electrode, an opposite electrode arranged to face the pixel electrode, and an emission layer between the pixel electrode and the opposite electrode, and the auxiliary layer may be arranged between the emission layer and the pixel electrode and/or between the emission layer and the opposite electrode.

At least two of the plurality of pixels may have different intervals between the pixel electrode and the opposite electrode.

Thicknesses of the auxiliary layers of the two pixels adjacent to each other among the plurality of pixels may be different from each other.

Thicknesses of the auxiliary layers of the two or more pixels adjacent to each other among the plurality of pixels may be different from each other.

The auxiliary layer may include a first auxiliary layer arranged on some of the plurality of pixels, and a second auxiliary layer arranged on others of the plurality of pixels, and at least a portion of the first auxiliary layer may overlap at least a portion of the second auxiliary layer.

A first line connecting centers of the first auxiliary layer and the second auxiliary layer arranged on a plane may intersect with a second line connecting centers of adjacent pixels among the plurality of pixels.

At least some of the plurality of pixels may form one pixel group, and a total thickness of the intermediate layers arranged in the one pixel group may be greatest in the pixel arranged at a center of the one pixel group.

The total thickness of the intermediate layers arranged in the one pixel group may decrease from the pixel arranged at the center of the one pixel group to a pixel arranged at an outer side of the one pixel group.

Thicknesses of at least two intermediate layers in the plurality of pixels may be different from each other.

Another exemplary embodiment of the invention provides a method of manufacturing a light-emitting device including arranging a process substrate and a mask assembly in a chamber, depositing a deposition material by supplying the deposition material from a deposition source to the process substrate through the mask assembly, shifting the process substrate or the mask assembly in a first direction, and depositing a deposition material by supplying the deposition material from the deposition source to the process substrate through the mask assembly.

The method may further include shifting the process substrate or the mask assembly in a second direction.

The first direction and the second direction may be perpendicular to each other.

The mask assembly may include a pattern hole through which the deposition material passes, and the pattern hole may be formed to guide the deposition material to at least two pixels arranged in a deposition area of the process substrate.

The deposition material may be deposited on the process substrate to form an auxiliary layer.

The method may further include depositing the deposition material in a deposition confirmation area of the process substrate.

The deposition confirmation area may be between adjacent deposition areas of the process substrate.

Another exemplary embodiment of the invention provides a method of manufacturing a light-emitting device including depositing a deposition material on a first area of a process substrate, and depositing a deposition material on a second area of the process substrate, wherein at least a portion of the first area overlaps at least a portion of the second area.

At least two pixels may be arranged in each of the first area and the second area, and a thickness of the deposition material in the pixel arranged only in the first area or the second area may be different from a thickness of the deposition material in the pixel arranged in an area in which the first area overlaps the second area.

These general and specific aspects may be implemented by using a system, a method, a computer program, or any combination thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 3 is a cross-sectional view of the light-emitting device taken along line C-C' of FIG. 2.

FIG. 12 is a cross-sectional view of a portion of a light-emitting portion of a light-emitting device, according to another embodiment.

FIG. 13 is a cross-sectional view of a portion of a light-emitting portion of a light-emitting device, according to another embodiment.

DETAILED DESCRIPTION

Figure 1:
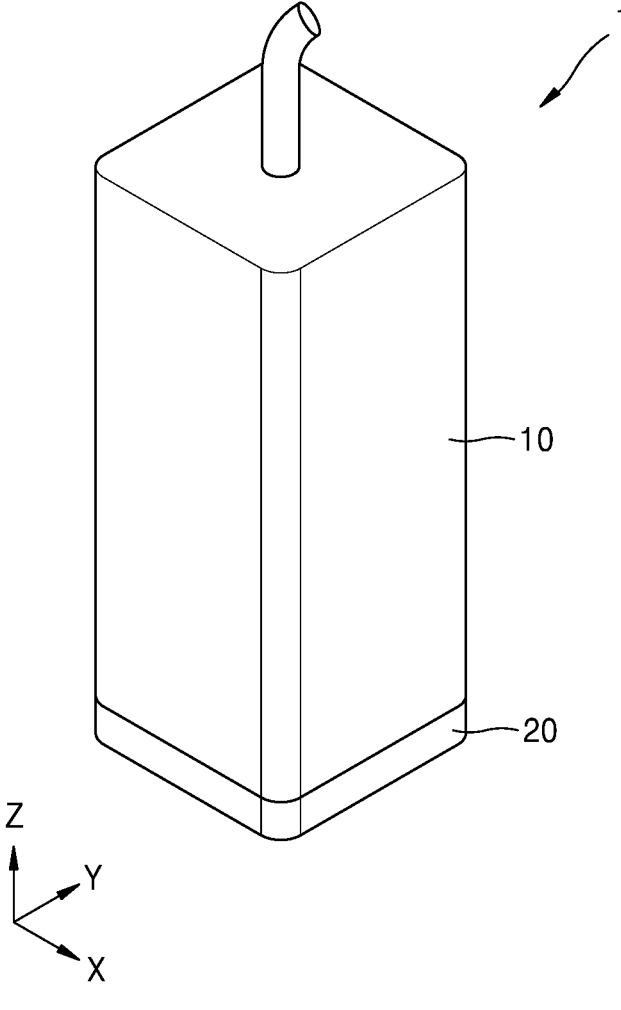
FIG. 1 is a perspective view of a light-emitting device according to an embodiment.

In the following description, for the purposes of explanation, numerous specific details are set forth in order to provide a thorough understanding of various exemplary embodiments of the invention. As used herein, "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" May refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" May be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a light-emitting device 1 according to an embodiment.

Referring to FIG. 1, the light-emitting device 1 may include a body portion 10 and a light-emitting portion 20. The body portion 10 may define an inner space therein, and various devices may be arranged in the inner space of the body portion 10. For example, a controller that controls the light-emitting portion 20, a power supply connected to the controller, and the like may be arranged in the body portion 10. In this case, the power supply may have various shapes. Specifically, the power supply may include a primary battery that is replaceably coupled to the body portion 10. In another embodiment, the power supply may include a battery, such as a rechargeable secondary battery, arranged in the body portion 10. In another embodiment, the power supply may include a device connected to the outside via a cable. In the above case, when the power supply includes a primary battery or a battery, the light-emitting device 1 may be portable. The body portion 10 may be connected to the outside via a cable or the like. The cable may be detachably connected to the body portion 10. In this case, various pieces of information may be input from the outside via the cable. In another embodiment, the body portion 10 may include a wireless communication module therein. In this case, the light-emitting device 1 may be connected to an external device through wireless communication to exchange information with the external device.

The light-emitting portion 20 may be connected to the body portion 10. In this case, the light-emitting portion 20 may emit light to the outside of the body portion 10. In this case, the light-emitting portion 20 may emit light having at least two or more wavelengths. In particular, the light-emitting portion 20 may emit at least two pieces of light having the same color and different wavelengths. For example, the light-emitting portion 20 may emit at least two pieces of light having a red color and different wavelengths. In another embodiment, the light-emitting portion 20 may emit at least two pieces of light having a blue color and different wavelengths. In another embodiment, the light-emitting portion 20 may emit at least two pieces of light having a red color and different wavelengths. In another embodiment, the light-emitting portion 20 may emit at least two pieces of light having a white color and different wavelengths. In this case, the light-emitting portion 20 may include a plurality of pixels, and the pixels may emit pieces of light having the same color.

Hereinafter, the light-emitting portion 20 will be described in detail.

Figure 2:
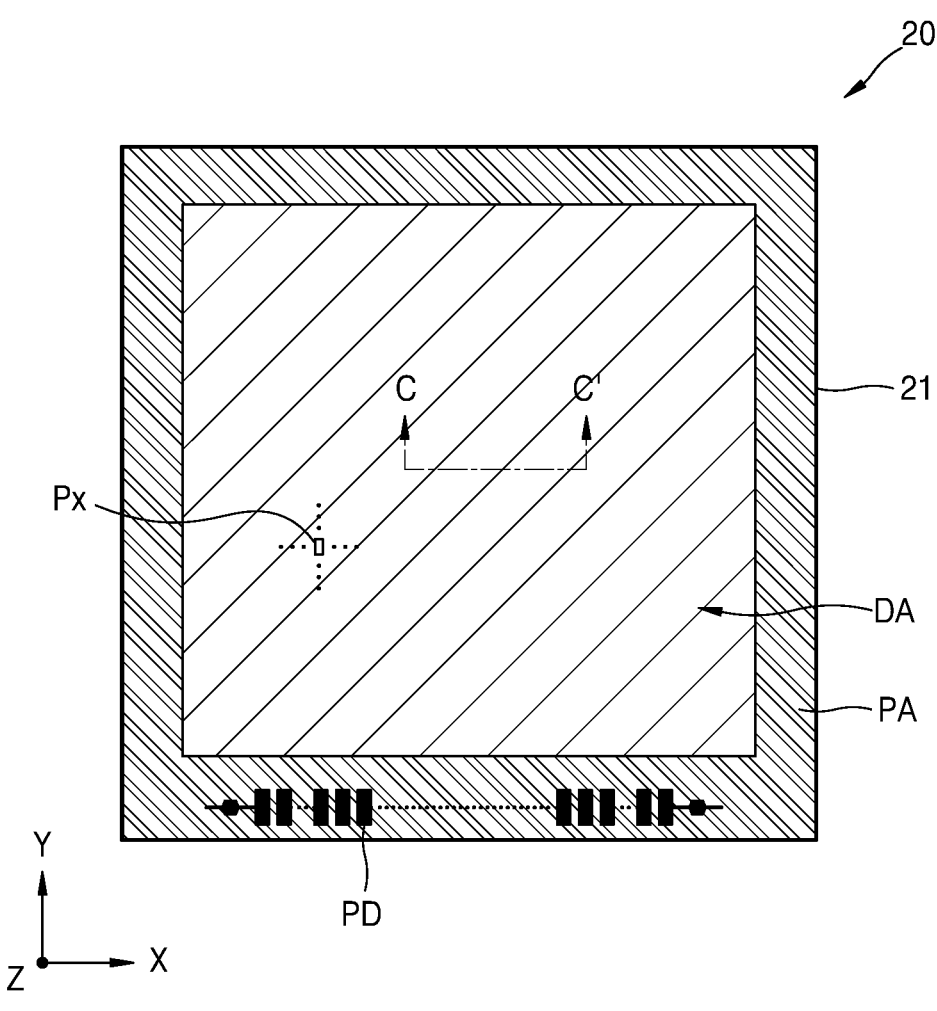
FIG. 2 is a bottom view of a light-emitting portion of the light-emitting device illustrated in FIG. 1.
Figure 3:
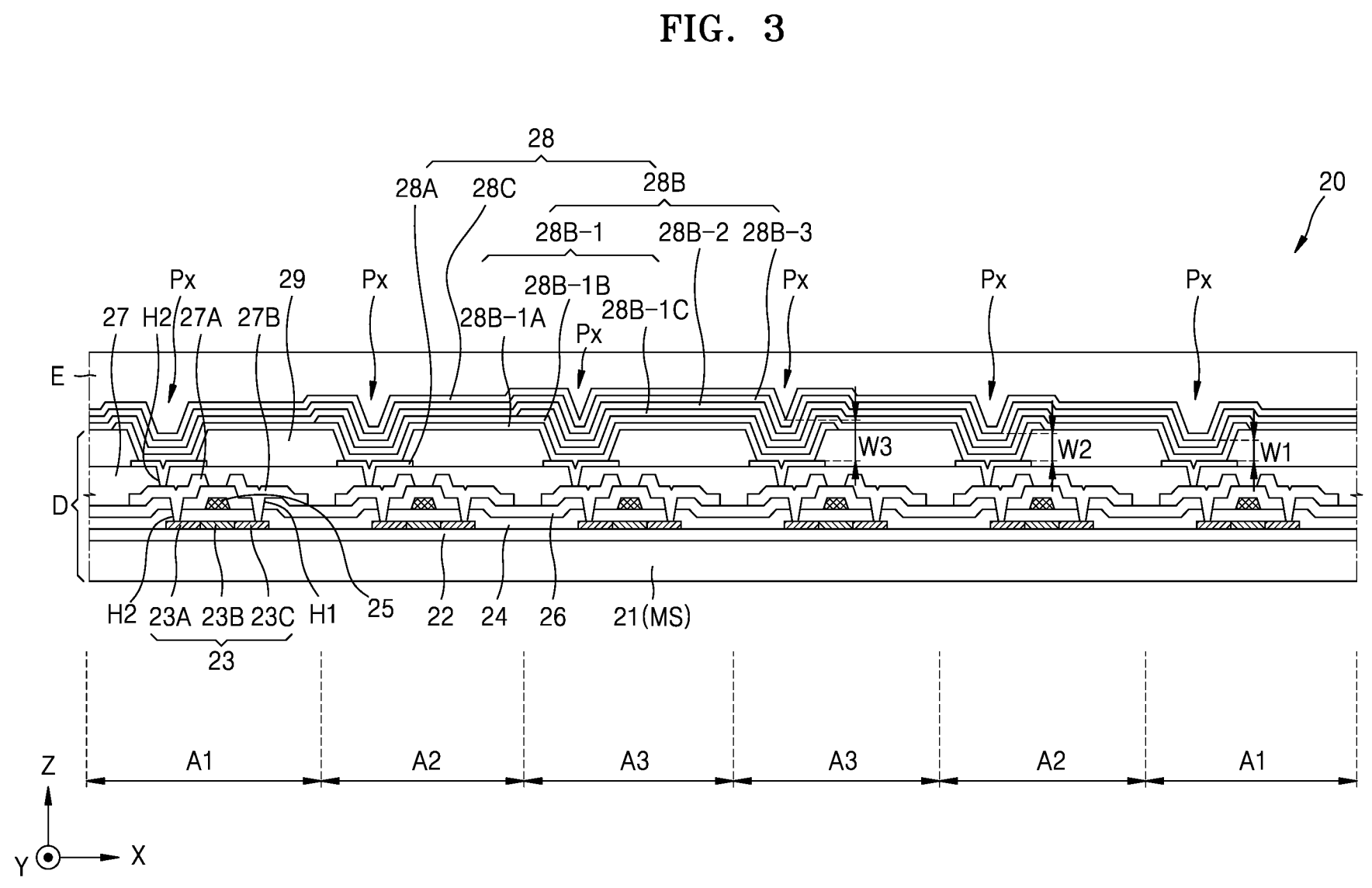

FIG. 2 is a bottom view of the light-emitting portion 20 of the light-emitting device 1 illustrated in FIG. 1. FIG. 3 is a cross-sectional view of the light-emitting device 1 taken along line C-C' of FIG. 2.

Referring to FIGS. 2 and 3, the light-emitting portion 20 may include a plurality of pixels Px. Each of the pixels Px may include one pixel electrode 28A and may emit one piece of light. In this case, each of the pixels Px may emit light having the same color. The pixel Px may be defined as an area in which one piece of light is emitted. For example, the pixel Px may be defined by an opened area of a pixel defining layer 29. In this case, the pixel Px may emit one of white light, red light, yellow light, green light, or blue light. In this case, all of the pixels Px may emit pieces of light having the same color.

The light-emitting portion 20 may define an emission area DA and a peripheral area PA outside the emission area DA on a substrate 21. The pixels Px may be arranged in the emission area DA, and a power line (not illustrated) and the like may be arranged in the peripheral area PA. Also, a pad portion PD may be arranged in the peripheral area PA. In this case, the peripheral area PA may be an area in which the pixels Px are not arranged and may be an area in which light is not emitted to the outside.

The light-emitting portion 20 may include a display substrate D and a sealing member (not illustrated) arranged on the display substrate D. In this case, the sealing member may include a sealing portion arranged in the display substrate D and an encapsulation substrate (not illustrated) connected to the sealing portion and arranged to face the substrate 21. In another embodiment, the sealing member may include a thin-film encapsulation layer E that shields at least a portion of the display substrate D. Hereinafter, for convenience of description, a case in which the sealing member includes the thin-film encapsulation layer E will be described.

The display substrate D may include a substrate 21, a thin-film transistor (TFT) arranged on the substrate 21, and an organic light-emitting device (OLED) 28.

The substrate 21 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 21 including the polymer resin may be flexible, rollable, or bendable. The substrate 21 may have a multiple layer structure including an inorganic layer (not illustrated) and a layer including the above-described polymer resin.

The TFT may be formed on the substrate 21, a passivation layer 27 may be formed to cover the TFT, and the OLED 28 may be formed on the passivation layer 27.

A buffer layer 22 including an organic compound and/or an inorganic compound may be further formed on the upper surface of the substrate 21. The buffer layer 22 may include $SiO_x$ or $SiN_x$.

An active layer 23 arranged in a certain pattern is formed on the buffer layer 22, and then, the active layer 23 is buried by a gate insulating layer 24. The active layer 23 includes a source region 23A and a drain region 23C, and further includes a channel region 23B between the source region 23A and the drain region 23C.

The active layer 23 may include various materials. For example, the active layer 23 may include an inorganic semiconductor material such as amorphous silicon or crystalline silicon. In another example, the active layer 23 may include an oxide semiconductor. In another example, the active layer 23 may include an organic semiconductor material. However, for convenience of description, a case in which the active layer 23 includes amorphous silicon will be described in detail.

The active layer 23 may be formed by forming an amorphous silicon layer on the buffer layer 22, crystallizing the amorphous silicon layer to form a polycrystalline silicon layer, and patterning the polycrystalline silicon layer.

In the active layer 23, the source region 23A and the drain region 23C are doped with impurities according to a type of a TFT such as a driving TFT (not illustrated) or a switching TFT (not illustrated).

A gate electrode 25 corresponding to the active layer 23 and an interlayer insulating layer 26 burying the gate electrode 25 are formed on the upper surface of the gate insulating layer 24.

Contact holes H1 are formed in the interlayer insulating layer 26 and the gate insulating layer 24, and a source electrode 27A and a drain electrode 27B are formed on the interlayer insulating layer 26 so as to come in contact with the source region 23A and the drain region 23C, respectively.

The passivation layer 27 is formed on the TFT, and a pixel electrode 28A of the OLED 28 is formed on the passivation layer 27. The pixel electrode 28A comes in contact with the source electrode 27A of the TFT via a via hole H2 formed in the passivation layer 27. The passivation layer 27 may include an inorganic material and/or an organic material, and may include a single layer, or two or more layers. The passivation layer 27 may be formed as a planarization layer so that the upper surface thereof is flat regardless of a concave or convex shape of a lower layer. Alternatively, the passivation layer may be concave or convex according to a concave or convex shape of a lower layer. The passivation layer 27 may include a transparent insulator so as to achieve a resonance effect.

After the pixel electrode 28A is formed on the passivation layer 27, the pixel defining layer 29 is formed to cover the pixel electrode 28A and the passivation layer 27 and is opened so that the pixel electrode 28A is exposed.

An intermediate layer 28B and an opposite electrode 28C are formed on the pixel electrode 28A. In another embodiment, the opposite electrode 28C may be formed on the entire surface of the display substrate D. In this case, the opposite electrode 28C may be formed on the intermediate layer 28B and the pixel defining layer 29. Hereinafter, for convenience of description, a case in which the opposite electrode 28C is formed on the intermediate layer 28B and the pixel defining layer 29 will be described in detail.

The pixel electrode 28A functions as an anode electrode, and the opposite electrode 28C functions as a cathode electrode. Of course, the polarities of the pixel electrode 28A and the opposite electrode 28C may be reversed.

The pixel electrode 28A and the opposite electrode 28C are insulated from each other by the intermediate layer 28B, and voltages of different polarities are applied to the intermediate layer 28B to emit light from an organic emission layer.

The intermediate layer 28B may include an organic emission layer 28B-2. As another optional example, the intermediate layer 28B may include at least one of an organic emission layer 28B-2, a lower auxiliary layer 28B-1, and an upper auxiliary layer 28B-3. In this case, the lower auxiliary layer 28B-1 may include a hole injection layer (HIL) and/or a hole transport layer (HTL). Also, the upper auxiliary layer 28B-3 may include an electron transport layer (ETL) and/or an electron injection layer (EIL). In this case, the upper auxiliary layer 28B-3 may be between the organic emission layer 28B-2 and the opposite electrode 28C, and the lower auxiliary layer 28B-1 may be between the organic emission layer 28B-2 and the pixel electrode 28A.

Some pixels Px may form one pixel group, and the one pixel group may include at least three pixels Px. Hereinafter, for convenience of description, a case in which one pixel group includes six pixels Px will be described in detail.

Thicknesses of intermediate layers 28B of the six pixels Px included in the one pixel group may be different from each other. In particular, the six pixels Px included in the one pixel group may be arranged in a row in one direction. For example, the six pixels Px may include three pairs of pixels Px. In this case, each pair of pixels Px may have the same thickness. Specifically, the intermediate layer 28B of the pixel Px arranged in a first area A1, which is an outermost area, in the one pixel group may have a first thickness W1. Also, the intermediate layer 28B of the pixel Px arranged in a third area A3, which is a middle area, in the one pixel group may have a third thickness W3. The intermediate layer 28B of the pixel Px arranged between the first area A1 and the third area A3 in the one pixel group may have a second thickness W2. In the above case, the first thickness W1 may be different from the second thickness W2, and the second thickness W2 may be different from the third thickness W3. Specifically, of the first to third thicknesses W1, W2, and W3, the first thickness W1 may be the smallest and the third thickness W3 may be the largest.

When the thicknesses of the intermediate layers 28B arranged in each pixel Px are different from each other, the pixels Px having different thicknesses may emit pieces of light having different wavelengths. For example, as the thickness of the intermediate layer 28B of each pixel Px increases, light having a longer wavelength may be generated. That is, in FIG. 3, the wavelength of light emitted from the first area A1 may be the shortest and the wavelength of light emitted from the third area A3 may be the longest. The wavelength of light emitted from the second area A2 is longer than the wavelength of light emitted from the first area A1 and may be shorter than the wavelength of light emitted from the third area A3.

In this case, the first area A1, the second area A2, and the third area A3 may be repeated in the one pixel group. In particular, the first area A1, the second area A2, and the third area A3 may be sequentially arranged in a first direction (e.g., an X-axis direction in FIG. 3) in a portion of the one pixel group, and the third area A3, the second area A2, and the first area A1 may be sequentially arranged in the first direction in another portion of the one pixel group. In this case, the two third areas A3 may be adjacent to each other, the two third areas A3 are between the two second areas A2, and the two second areas A2 and the two third areas A3 may be between the two first areas A1. In this case, the one pixel group may be between the two third areas A3, and both sides thereof may be symmetrical with respect to a center line of the two third areas A3 (e.g., a straight line arranged in a Z-axis direction in FIG. 3). In the above case, the thickness of the intermediate layer 28B of the pixels Px arranged in each area may decrease sequentially as the distance from the center line of the two third areas A3 increases. For example, the thickness of the intermediate layer 28B may decrease in a direction from the third area A3 to the first area A1. In this case, the thickness of the intermediate layer 28B may be equal to the distance between the pixel electrode 28A and the opposite electrode 28C of each pixel Px. That is, the thickness of the intermediate layer 28B may mean a height from the upper surface of the pixel electrode 28A to the lower surface of the opposite electrode 28C in each pixel Px. In another embodiment, the thickness of the intermediate layer 28B of the pixel Px arranged closest to the center line with respect to the center line of the one pixel group may decrease as the distance from the center line of the one pixel group increases. That is, when the center line of the pixel group passes through the center of the pixel Px arranged at the center of the pixel group, the thickness of the intermediate layer 28B of the pixel Px may be greater than the thicknesses of the intermediate layers 28B of the other pixels Px.

In the above case, the thicknesses of the intermediate layers 28B of the pixels Px adjacent to each other among the six pixels Px arranged in the one pixel group may be different from each other. For example, the second thickness W2 of the intermediate layer 28B of the pixel Px arranged in the second area A2 and the third thickness W3 of the intermediate layer 28B of the pixel Px arranged in the third area A3 adjacent to the second area A2 may be different from each other. For example, the first thickness W1 of the intermediate layer 28B of the pixel Px arranged in the first area A1 and the third thickness W3 of the intermediate layer 28B of the pixel Px arranged in the third area A3 adjacent to the first area A1 may be different from each other.

Each of the pixels Px may include a pixel electrode 28A, an organic emission layer 28B-2, an auxiliary layer, and an opposite electrode 28C. In this case, the pixel electrode 28A may be arranged to correspond to each of the pixels Px, and the organic emission layer 28B-2 and the opposite electrode 28C may be arranged on the entire surface of the substrate 21 of the light-emitting portion 20. In this case, the pixels Px may share the organic emission layer 28B-2 and the opposite electrode 28C with each other. Also, at least two pixels Px adjacent to each other among the pixels Px may share the auxiliary layer with each other. In particular, in these cases, the auxiliary layer may be arranged over at least two pixels Px adjacent to each other among the pixels Px and the upper surface of the pixel defining layer 29 arranged between the at least two pixels Px adjacent to each other among the pixels Px. For example, the pixel Px arranged in the third area A3 and the pixel Px arranged in the second area A2 in FIG. 3 may share the upper auxiliary layer 28B-3 and/or the lower auxiliary layer 28B-1 with each other.

A plurality of upper auxiliary layers 28B-3 may be provided, and/or a plurality of lower auxiliary layers 28B-1 may be provided. For example, a plurality of upper auxiliary layers 28B-3 may be provided, and only one lower auxiliary layer 28B-1 may be provided. In another embodiment, only one upper auxiliary layer 28B-3 may be provided, and a plurality of lower auxiliary layers 28B-1 may be provided. In another embodiment, a plurality of upper auxiliary layers 28B-3 and a plurality of lower auxiliary layers 28B-1 may be provided. Hereinafter, for convenience of description, a case in which a plurality of lower auxiliary layers 28B-1 are provided will be described in detail.

The lower auxiliary layer 28B-1 may include at least two lower auxiliary layers 28B-1 arranged to be stacked on each other. In the following, for convenience of description, a case in which three lower auxiliary layers 28B-1 are provided will be described in detail. For example, the lower auxiliary layer 28B-1 may include a first lower auxiliary layer 28B-1A, a second lower auxiliary layer 28B-1B, and a third lower auxiliary layer 28B-1C. In this case, the first lower auxiliary layer 28B-1A, the second lower auxiliary layer 28B-1B, and the third lower auxiliary layer 28B-1C may include the same material or different materials. For example, all of the first lower auxiliary layer 28B-1A, the second lower auxiliary layer 28B-1B, and the third lower auxiliary layer 28B-1C may be a hole injection layer or a hole transport layer. In another embodiment, one of the first lower auxiliary layer 28B-1A, the second lower auxiliary layer 28B-1B, and the third lower auxiliary layer 28B-1C may be a hole injection layer, and the others thereof may be a hole transport layer. In the following, for convenience of description, a case in which all of the first lower auxiliary layer 28B-1A, the second lower auxiliary layer 28B-1B, and the third lower auxiliary layer 28B-1C include the same material will be described in detail.

The first lower auxiliary layer 28B-1A, the second lower auxiliary layer 28B-1B, and the third lower auxiliary layer 28B-1C may be arranged in different areas from each other. That is, one of the first lower auxiliary layer 28B-1A, the second lower auxiliary layer 28B-1B, the third lower auxiliary layer 28B-1C may at least partially overlap the other one thereof on a plane. For example, on the left side of FIG. 3, the first lower auxiliary layer 28B-1A may be arranged to cover the pixel Px arranged in the first area A1, the pixel Px arranged in the second area A2, and the pixels Px arranged in the two third areas A3. In this case, the pixel Px arranged in the first area A1, the pixel Px arranged in the second area A2, and the pixels Px arranged in the two third areas A3, which are adjacent to each other, may share the first lower auxiliary layer 28B-1A. The second lower auxiliary layer 28B-1B may be arranged to cover the pixel Px arranged in the second area A2 on the left side of FIG. 3, the pixels Px arranged in the two third areas A3, and the pixel Px arranged in the second area A2 on the right side of FIG. 3. The third lower auxiliary layer 28B-1C may be arranged to cover the pixels Px arranged in the two third areas A3 in FIG. 3, the pixel Px arranged in the second area A2 on the left side of FIG. 3, and the pixel Px arranged in the first area A1 on the right side of FIG. 3. In this case, similar to the first lower auxiliary layer 28B-1A, the adjacent pixels Px may share the second lower auxiliary layer 28B-1B and the third lower auxiliary layer 28B-1C.

In the above case, only the first lower auxiliary layer 28B-1A may be arranged in one of the pixels Px arranged in the two first areas A1, and only the third lower auxiliary layer 28B-1C may be arranged in the other of the pixels Px arranged in the two first areas A1. Also, the first lower auxiliary layer 28B-1A and the second lower auxiliary layer 28B-1B may be arranged in one of the pixels Px arranged in the two second areas A2, and the second lower auxiliary layer 28B-1B and the third lower auxiliary layer 28B-1C may be sequentially stacked in the other of the pixels Px arranged in the two second areas A2. Each of the pixels Px arranged in the two third areas A3 may include the first lower auxiliary layer 28B-1A, the second lower auxiliary layer 28B-1B, and the third lower auxiliary layer 28B-1C, which are sequentially stacked. When the first lower auxiliary layer 28B-1A, the second lower auxiliary layer 28B-1B, and the third lower auxiliary layer 28B-1C are arranged as described above, the thicknesses of the lower auxiliary layers 28B-1 arranged in the pixels Px may be different from each other.

An end of at least one of the first lower auxiliary layer 28B-1A, the second lower auxiliary layer 28B-1B, and the third lower auxiliary layer 28B-1C may be arranged on the pixel defining layer 29. That is, the end of at least one of the first lower auxiliary layer 28B-1A, the second lower auxiliary layer 28B-1B, and the third lower auxiliary layer 28B-1C may be arranged between the adjacent pixels.

The organic emission layer 28B-2, the upper auxiliary layer 28B-3, and the opposite electrode 28C may be sequentially stacked on the lower auxiliary layer 28B-1. Also, a thin-film encapsulation layer E may be arranged on the opposite electrode 28C.

The thin-film encapsulation layer E may include a plurality of inorganic layers, or may include an inorganic layer and an organic layer.

The organic layer of the thin-film encapsulation layer E may include a polymer-based material. The polymer-based material may include polyethylene terephthalate, polyethylene naphthalate, polycarbonate, polyimide, polyethylenesulfonate, polyoxymethylene, polyarylate, hexamethyldisiloxane, acrylic resin (e.g., polymethylmethacrylate, polyacrylic acid, etc.), or any combination thereof.

The inorganic layer of the thin-film encapsulation layer E may include one or more inorganic insulating materials selected from aluminum oxide, titanium oxide, tantalum oxide, hafnium oxide, zinc oxide, silicon oxide, silicon nitride, and silicon oxynitride.

The upper layer of the thin-film encapsulation layer exposed to the outside may include an inorganic layer so as to prevent moisture permeation to the OLED 28.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers. As another example, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may include a first inorganic encapsulation layer, a first organic encapsulation layer, and a second inorganic encapsulation layer sequentially disposed from the top of the OLED 28.

In another example, the thin-film encapsulation layer E may include a first inorganic encapsulation layer, a first organic encapsulation layer, a second inorganic encapsulation layer, a second organic encapsulation layer, and a third inorganic encapsulation layer sequentially disposed from the top of the OLED 28.

In another example, the thin-film encapsulation layer E may include a first inorganic encapsulation layer, a first organic encapsulation layer, a second inorganic encapsulation layer, a second organic encapsulation layer, a third inorganic encapsulation layer, a third organic encapsulation layer, and a fourth inorganic layer sequentially disposed from the top of the OLED 28.

A metal halide layer including LiF may be further included between the OLED 28 and the first inorganic encapsulation layer. When the first inorganic encapsulation layer is formed by sputtering, the metal halide layer may prevent the OLED 28 from being damaged.

The areas of the first organic encapsulation layer may be less than the area of the second inorganic encapsulation layer, and the area of the second organic encapsulation layer may also be less than the area of the third inorganic encapsulation layer.

When the inorganic layers are provided as described above, the inorganic layers may be deposited so as to come in direct contact with each other at edges of the light-emitting portion 20, and the organic layer may not be exposed to the outside.

Therefore, the light-emitting portion 20 may emit pieces of light having different wavelengths to the outside while emitting pieces of light having the same color.

The light-emitting portion 20 may operate in various ways. For example, the light-emitting portion 20 may operate so that a pixel arranged in at least one of the first area A1, the second area A2, and the third area A3, which are arranged in one pixel group, emits light.

Specifically, the light-emitting portion 20 may operate such that only the pixel Px arranged in the first area A1, the second area A2, or the third area A3 emits light, and thus, light having one wavelength is emitted to the outside.

In another embodiment, the light-emitting portion 20 may operate such that the pixels Px arranged in at least two of the first area A1, the second area A2, and the third area A3 emit light, and thus, pieces of light having at least two wavelengths are emitted.

In another embodiment, the light-emitting portion 20 may operate such that the pixels Px respectively arranged in the first area A1, the second area A2, and the third area A3 emit light according to time, and thus, pieces of light having different wavelengths are emitted at different times.

Because the light-emitting portion 20 may freely emit pieces of light having various wavelengths, pieces of light having various effects may be provided to a user.

Figure 4:
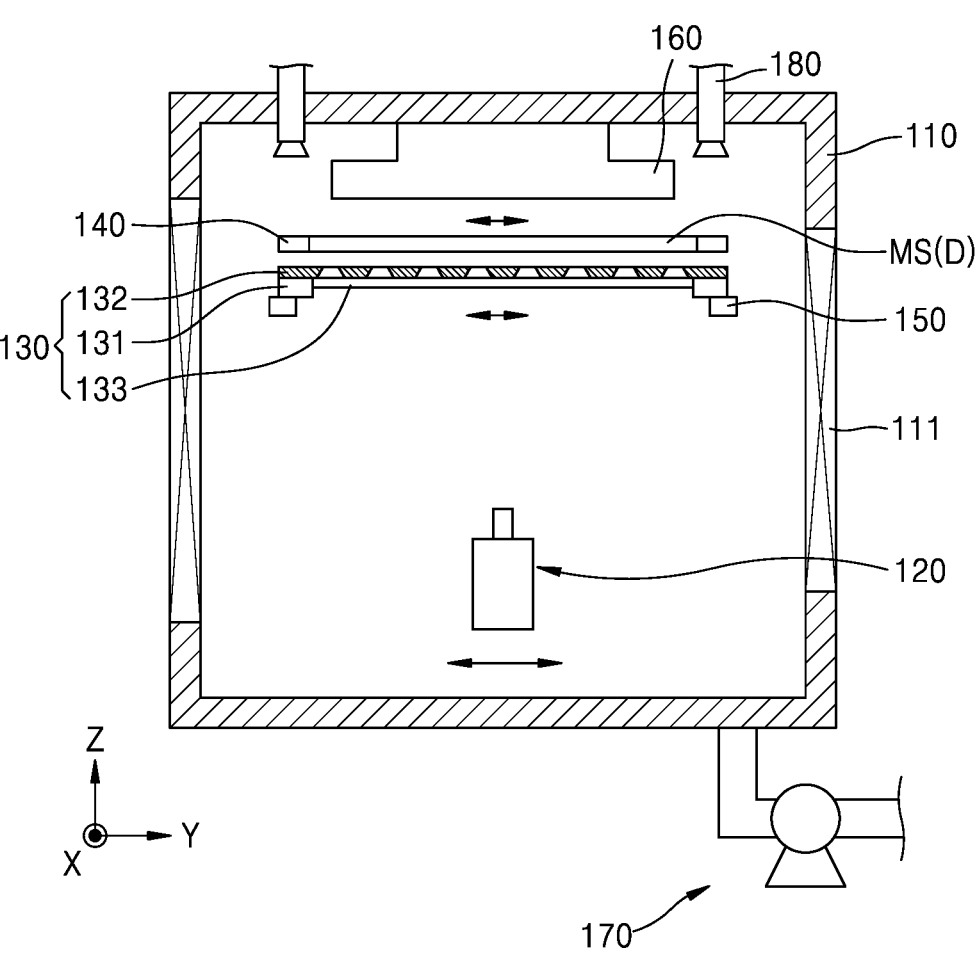
FIG. 4 is a cross-sectional view illustrating an apparatus for manufacturing a light-emitting device, according to an embodiment.
Figure 5:
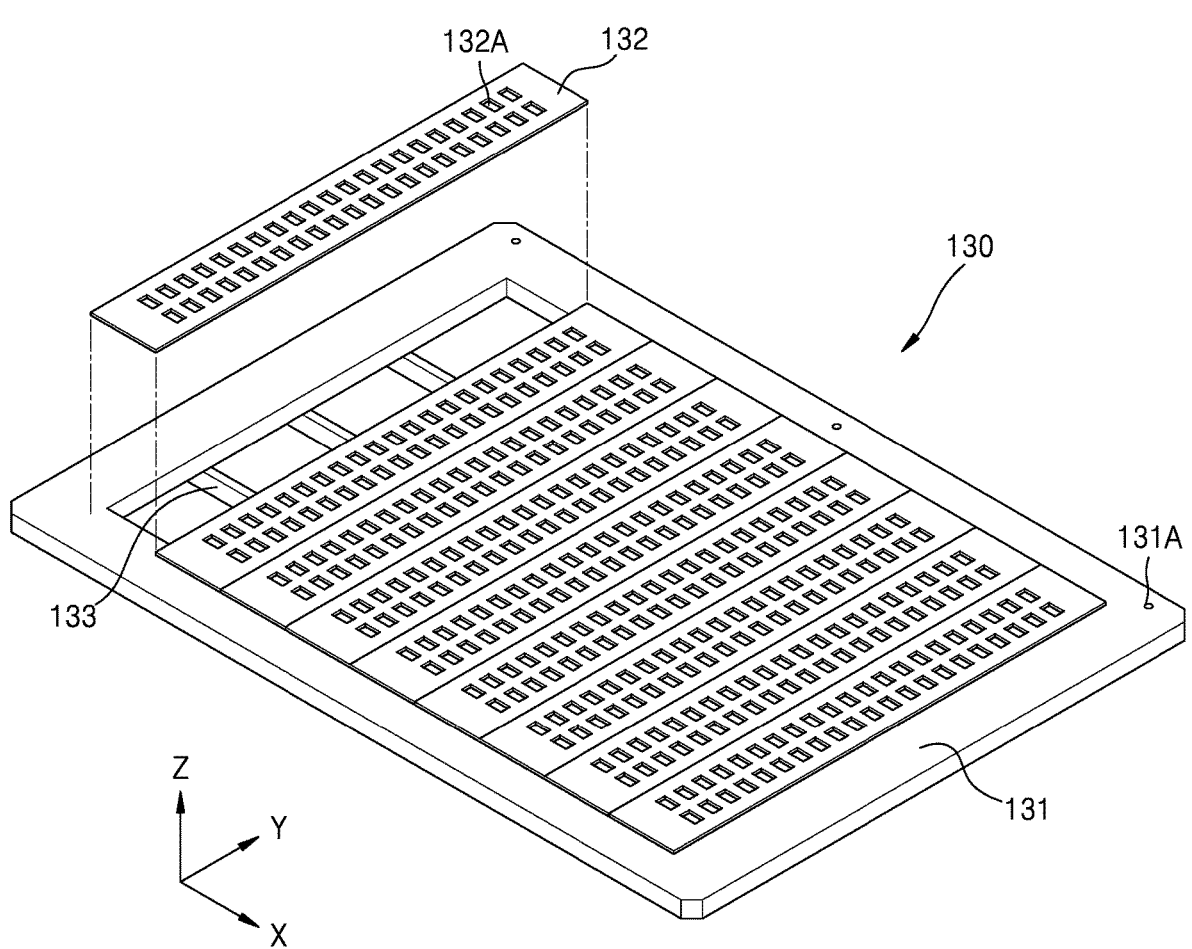
FIG. 5 is a perspective view of a mask assembly illustrated in FIG. 4.

FIG. 4 is a cross-sectional view illustrating an apparatus for manufacturing a light-emitting device, according to an embodiment. FIG. 5 is a perspective view of a mask assembly illustrated in FIG. 4.

Referring to FIGS. 4 and 5, the apparatus for manufacturing the light-emitting device may include a chamber 110, a deposition source 120, a mask assembly 130, a substrate support 140, a mask support 150, and a magnetic force generator 160, a pressure regulator 170, and a vision portion 180.

The chamber 110 may define an inner space therein, and one side of the chamber 110 may be opened so that a process substrate MS is unloaded from the chamber 110 or is accommodated in the chamber 110. In this case, a shielding portion 111 including a gate valve or the like may be arranged in the opened portion of the chamber 110 to selectively open or close the chamber 110. The process substrate MS may be formed in various forms. For example, the process substrate MS may include one deposition area. In another embodiment, the process substrate MS may include at least two deposition areas. In this case, at least two deposition areas may be spaced apart from each other. In the deposition area, the pixel electrode or the organic emission layer may be formed on the substrate. In another embodiment, the process substrate MS may refer to the substrate itself of the above-described display device. In another embodiment, the process substrate MS may mean a state in which the above-described various layers are formed on an original substrate, and the original substrate is divided into at least two parts. In another embodiment, the process substrate MS may refer to the above-described display substrate D.

The deposition source 120 may accommodate a deposition material for forming at least one of the auxiliary layers described above. In this case, the deposition source 120 may vaporize or sublimate the deposition material by applying energy (e.g., heat energy, light energy, vibration energy, etc.).

The deposition source 120 may be replaceable. At this time, the deposition source 120 may be replaced with a new deposition source 120 when the accommodated deposition material is exhausted. Also, the deposition source 120 may be fixed inside the chamber 110, or may be linearly movable.

The mask assembly 130 may include a mask frame 131, a mask sheet 132, and a support frame 133.

The mask frame 131 may have an opening formed in the center thereof. In this case, the mask frame 131 may be formed in a shape such as a window frame. In another embodiment, the mask frame 131 may have an opening formed in the center thereof, and a separate frame dividing the opening in a grid shape may be arranged. Hereinafter, for convenience of description, the mask frame 131 having one opening formed in the center thereof will be described in detail.

The mask sheet 132 may be arranged on one surface of the mask frame 131 in a state of being stretched in the first direction and/or the second direction and may be fixed to the mask frame 131 through welding or the like. In this case, a groove may be formed in the mask frame 131 to accommodate the mask sheet 132. The mask sheet 132 may be formed in a rectangular shape and may be arranged at one side of the mask frame 131. Also, the mask sheet 132 may be formed in a slit shape.

In an embodiment, a plurality of mask sheets 132 may be provided. In this case, the mask sheets 132 may be arranged in a row so as to be adjacent to each other in the first direction or the second direction. In particular, in this case, the long side of the mask sheet 132 may be arranged parallel to the long side or the short side of the mask frame 131.

In another embodiment, one mask sheet 132 may be provided to completely shield the upper surface of the mask frame 131.

Hereinafter, for convenience of description, a case in which a plurality of mask sheets 132 are provided and the long sides of the mask sheets 132 are arranged in the X-axis direction of FIG. 5 will be described in detail.

A plurality of pattern holes 132A may be provided in the mask sheet 132. In this case, the pattern holes 132A may be apart from each other in the first direction and the second direction. In particular, the pattern holes 132A may be formed in various shapes. For example, in an embodiment, the pattern holes 132A may have a rhombus shape in which vertices are arranged in a tensile direction of the mask sheet 132. In another embodiment, the pattern holes 132A may have a rectangular shape. In this case, the long side of the pattern hole 132A may be arranged in the length direction of the mask sheet 132 or in a direction perpendicular to the length direction of the mask sheet 132. In another embodiment, the pattern holes 132A may have a circular shape. However, for convenience of description, a case in which the pattern hole 132A has a rectangular shape will be described in detail.

The pattern hole 132A may be arranged to correspond to at least some pixels Px arranged on the process substrate MS (or the display substrate D). That is, in a plan view, openings of at least two pixel defining layers 29 may be arranged inside the pattern hole 132A.

The mask frame 131 and the mask sheet 132 may each include a confirmation hole 131A for confirming the degree of deposition of the deposition material. In this case, the confirmation hole 131A may be formed in a shape different from that of the pattern hole 132A. Hereinafter, for convenience of description, a case in which the confirmation hole 131A is arranged in the mask frame 131 will be described in detail.

The support frame 133 may be arranged on the mask frame 131 to support the mask frame 131 and also support the mask sheet 132. In this case, the support frame 133 may be arranged on the mask frame 131 in a grid form to define a display area (not illustrated) of one display device (not illustrated). That is, the support frame 133 may define a plurality of display areas by dividing the central opening of the mask frame 131 into a plurality of areas.

The substrate support 140 may support the process substrate MS. In this case, the substrate support 140 may support the process substrate MS in such a manner that the process substrate MS is seated on the substrate support 140, or the substrate support 140 may support the process substrate MS by adsorbing or attaching one surface of the process substrate MS. For example, the substrate support 140 may include a frame, a bar, or the like, which is fixed inside the chamber 110. In another embodiment, the substrate support 140 may include a clamp configured to hold the process substrate MS. In another embodiment, the substrate support 140 may include an adhesive chuck or an electrostatic chuck. In this case, the substrate support 140 may be integrally formed with the magnetic force generator 160. In another embodiment, the substrate support 140 may include a shuttle configured to transfer the process substrate MS from the outside of the chamber 110 to the inside of the chamber 110. However, for convenience of description, a case in which the substrate support 140 includes a shuttle will be described in detail.

The mask support 150 may support the mask assembly 130. In this case, because the mask support 150 may be identical or similar to the substrate support 140 described above, a detailed description thereof will be omitted for convenience of description. Also, a case in which the mask support 150 includes the frame fixed inside the chamber 110 and the mask assembly 130 is seated and supported to the frame will be described in detail.

The magnetic force generator 160 may be arranged in the chamber 110 to bring the mask frame 131 into close contact with the process substrate MS. In this case, the magnetic force generator 160 may include an electromagnet.

The pressure regulator 170 may be connected to the chamber 110 to regulate the pressure inside the chamber 110. In this case, the pressure regulator 170 may include a pipe connected to the chamber 110, and a pump arranged in the pipe.

The vision portion 180 may be arranged in the chamber 110. In this case, the vision portion 180 may be arranged to be inserted into the chamber 110, or may be arranged outside the chamber 110. Although not illustrated, when the vision portion 180 is arranged outside the chamber 110, a transmission window may be separately provided in the chamber 110. The vision portion 180 may include a camera configured to capture an image.

Regarding the operation of the apparatus 100 for manufacturing the light-emitting device, the apparatus 100 for manufacturing the light-emitting device may form at least one of the auxiliary layers on the process substrate MS.

Specifically, the process substrate MS and the mask assembly 130 may be charged into the chamber 110. In this case, one deposition area may be arranged on one surface of the process substrate MS, or a plurality of deposition areas apart from each other may be arranged on the process substrate MS. Such a deposition area may become a display device when a plurality of layers are arranged on the process substrate MS. In an embodiment, before the auxiliary layers are formed by the apparatus 100 for manufacturing the light-emitting device, the pixel electrode 28A described above with reference to FIG. 3 may be formed in the deposition area. In an embodiment, before the auxiliary layers are formed by the apparatus 100 for manufacturing the light-emitting device, the organic emission layer 28B-2 described above with reference to FIG. 3 may be formed in the deposition area.

When the process substrate MS and the mask assembly 130 are seated on the substrate support 140 and the mask support 150, respectively, the positions of the process substrate MS and the mask assembly 130 may be photographed through the vision portion 180, and the positions of the process substrate MS and the mask assembly 130 may be aligned with each other based on the photographed positions.

When the above process is completed, the deposition material may be supplied from the deposition source 120 to the process substrate MS. In this case, the deposition material may be deposited on the process substrate MS through the pattern hole 132A. The above process may be performed on a portion of the process substrate MS, and the deposition material may be deposited on the entire surface of the process substrate MS by changing the position of the process substrate MS or the mask assembly 130. In this case, the process substrate MS may include deposition areas in which the deposition materials are deposited in a certain pattern and spaced apart from each other. When such deposition areas are deposited, the apparatus 100 for manufacturing the light-emitting device may perform deposition a plurality of times. That is, the apparatus 100 for manufacturing the light-emitting device may form the auxiliary layers with different thicknesses in the respective portions of the deposition area by depositing the deposition material in the deposition area while changing the position of the mask assembly 130.

When the above process is completed in the apparatus 100 for manufacturing the light-emitting device, the process substrate MS may be unloaded from the chamber 110 and transferred to another apparatus for manufacturing a light-emitting device to form an organic emission layer, another auxiliary layer, an opposite electrode, a thin-film encapsulation layer, and the like on the auxiliary layer. In another embodiment, when the above process is completed, the process substrate MS may be unloaded from the chamber 110 and transferred to another apparatus for manufacturing a light-emitting device to form an opposite electrode, a thin-film encapsulation layer, and the like on the auxiliary layer.

Therefore, the apparatus 100 for manufacturing the light-emitting device forms an auxiliary layer at least two or more times on the corresponding portion of the process substrate MS of at least one pixel Px, thereby freely adjusting the thickness of the intermediate layer of the pixel Px. Also, because the apparatus 100 for manufacturing the light-emitting device does not need to use a separate equipment or a plurality of mask assemblies 130 so as to adjust the thickness of the auxiliary layer on one process substrate MS, the manufacturing time and the manufacturing costs may be reduced.

Figure 6:
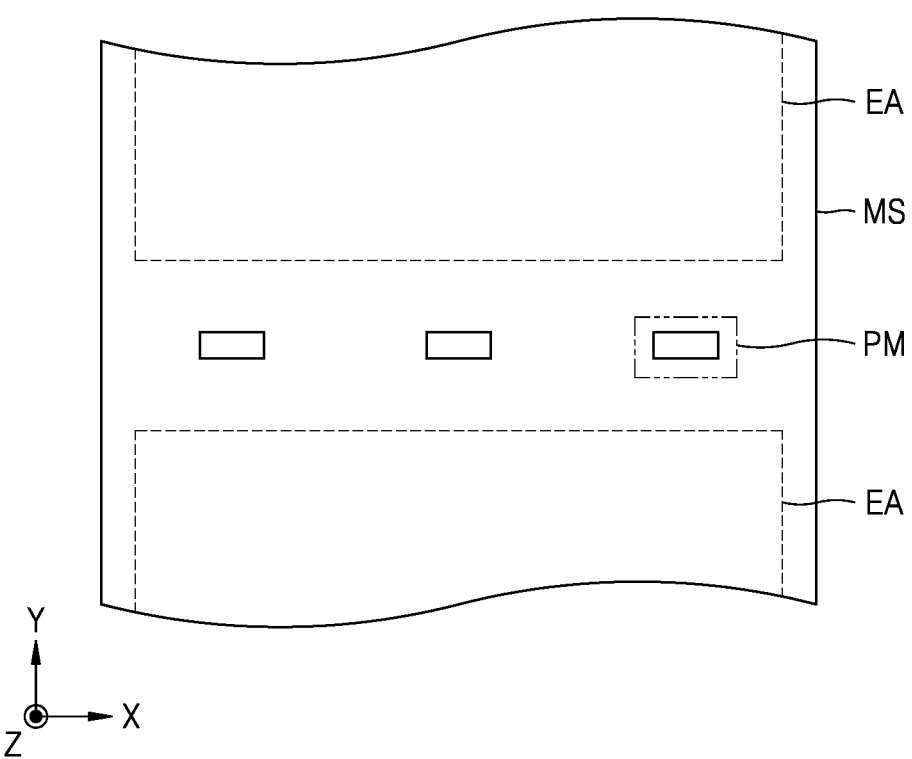
FIG. 6 is a plan view of a portion of a process substrate illustrated in FIG. 4.

FIG. 6 is a plan view of a portion of the process substrate MS illustrated in FIG. 4.

Referring to FIG. 6, a deposition confirmation portion PM may be arranged on the process substrate MS. In this case, when the process substrate MS includes a plurality of deposition areas EA, the deposition confirmation portion PM may be between the deposition areas EA of the process substrate MS. In another embodiment, when the process substrate MS includes one deposition area EA, the deposition confirmation portion PM may be arranged on the outer portion of the deposition area EA of the process substrate MS.

Figure 7:
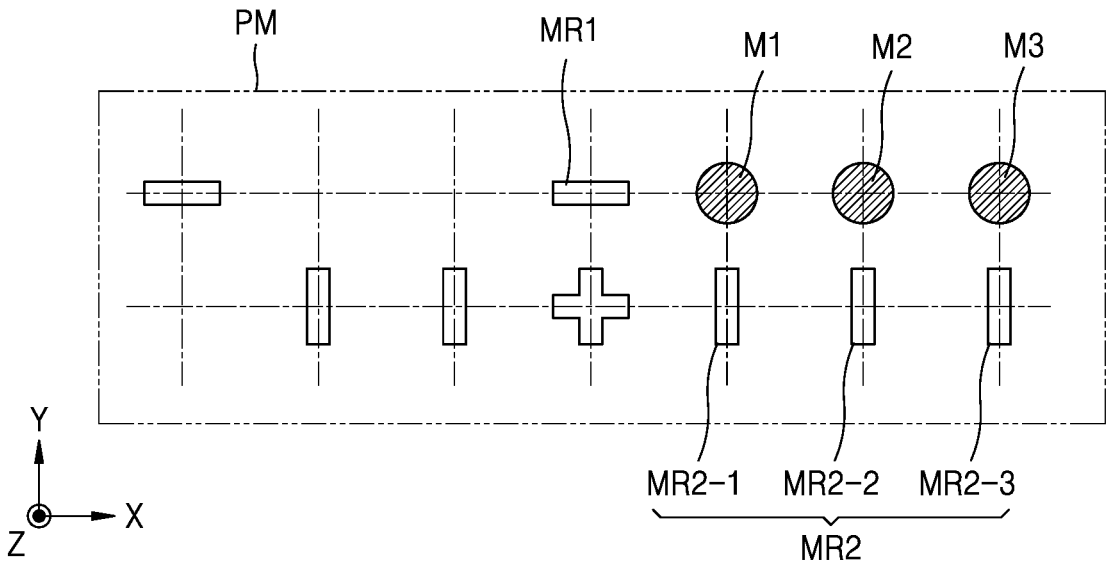
FIG. 7 is a plan view of a deposition confirmation portion of a process substrate, according to an embodiment.
Figure 8:
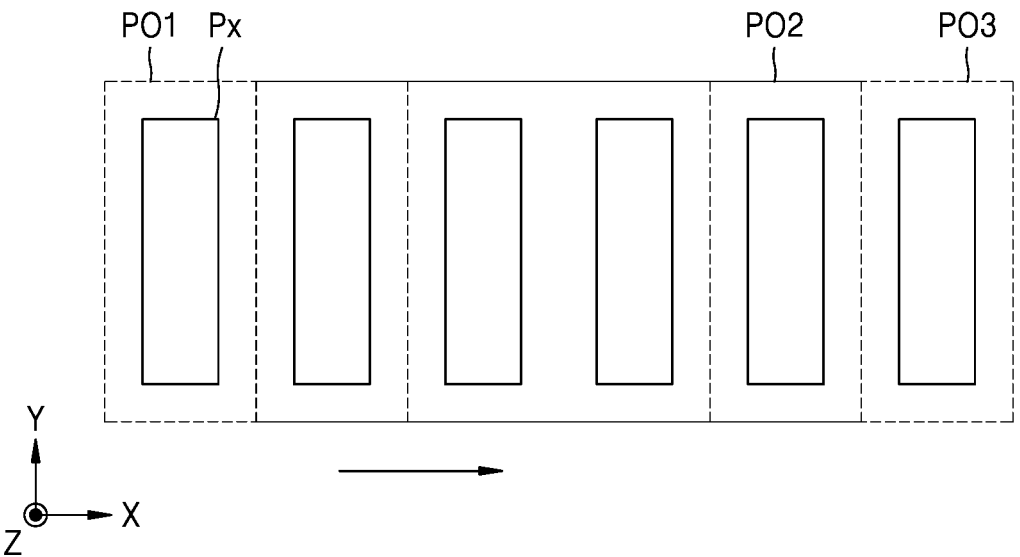
FIG. 8 is a plan view illustrating a deposition method according to an embodiment.

FIG. 7 is a plan view of a deposition confirmation portion PM of a process substrate, according to embodiments. FIG. 8 is a plan view illustrating a deposition method according to an embodiment.

Referring to FIGS. 6 to 8, various patterns may be arranged in the deposition confirmation portion PM. For example, the deposition confirmation portion PM may include a first direction pattern MR1 arranged in a first direction and a second direction pattern MR2 arranged in a second direction. In this case, the second direction pattern MR2 may include a $(2\text{-}1)^{th}$ direction pattern MR2-1, a $(2\text{-}2)^{th}$ direction pattern MR2-2, and a $(2\text{-}3)^{th}$ direction pattern MR2-3. The $(2\text{-}1)^{th}$ direction pattern MR2-1, the $(2\text{-}1)^{th}$ direction pattern MR2-2, and the $(2\text{-}3)^{th}$ direction pattern MR2-3 may be apart from each other in the first direction. In this case, the first direction and the second direction may be perpendicular to each other.

In the above case, a deposition material passing through a confirmation hole 131A may be deposited on the deposition confirmation portion PM. In particular, when the deposition material passes through the confirmation hole 131A, a first deposition material pattern M1 may be arranged at a first point at which an extension line of the first direction pattern MR1 and an extension line of the $(2\text{-}1)^{th}$ direction pattern MR2-1 intersect with each other. Also, when the mask assembly 130 is shifted once in the first direction and the deposition is then performed, a second deposition material pattern M2 may be arranged at a second point. When the mask assembly 130 is shifted once more in the first direction and the deposition is then performed, a third deposition material pattern M3 may be arranged at a third point. In this case, the confirmation hole 131A may be arranged in the mask frame 131 of the most downstream side with respect to the shifting direction of the mask assembly 130.

When the deposition is performed while the mask assembly 130 is shifted, the pattern hole 132A may be arranged at a position PO1, as illustrated in FIG. 8. In this case, the pattern holes 132A may be arranged to correspond to four pixels Px arranged in the first to third areas A1 to A3 on the left side of FIG. 3. In this case, the deposition material passing through the pattern hole 132A may be deposited on a portion of the process substrate MS corresponding to the pattern hole 132A of the first position PO1. When the mask assembly 130 is shifted once, the pattern hole 132A may be arranged at a second position PO2. In this case, the pattern holes 132A may be arranged to correspond to pixels Px arranged in the second area A2 and the third area A3 on the left side of FIG. 3 and the second area A2 on the right side of FIG. 3. In this case, the deposition material passing through the pattern hole 132A may be deposited on the corresponding pixel Px. Also, when the mask assembly 130 is shifted again, the pattern hole 132A may be shifted from the second position PO2 to the third position PO3. In this case, the pattern hole 132A of the third position PO3 may be arranged to correspond to pixels Px arranged in two third areas A3 in FIG. 3, the second area A2 on the right side of FIG. 3, and the first area A1 on the right side of FIG. 3.

When the mask assembly 130 is shifted as described above, whether the shifting of the mask assembly 130 is performed accurately may be evaluated by comparing the pattern of the deposition material arranged on the process substrate MS through the confirmation hole 131A with the first direction pattern MR1 and the second direction pattern MR2.

That is, after the first deposition material pattern M1, the second deposition material pattern M2, and the third deposition material pattern M3 are formed at a point at which the first direction pattern MR1 and the second direction pattern MR2 intersect with each other, whether the first deposition material pattern M1, the second deposition material pattern M2, and the third deposition material pattern M3 are formed at the correct points are determined through the vision portion 180. In this manner, the accuracy of the shifting of the mask assembly 130 may be confirmed.

The case of fixing the process substrate MS and shifting the mask assembly 130 has been described in detail, but embodiments of the disclosure are not limited thereto.

Specifically, the above operation may be performed while fixing the mask assembly 130 and shifting the process substrate MS. In this case, the deposition process may be performed on the process substrate MS while shifting the process substrate MS in a direction opposite to the shifting direction of the mask assembly 130 described above.

Figure 9:
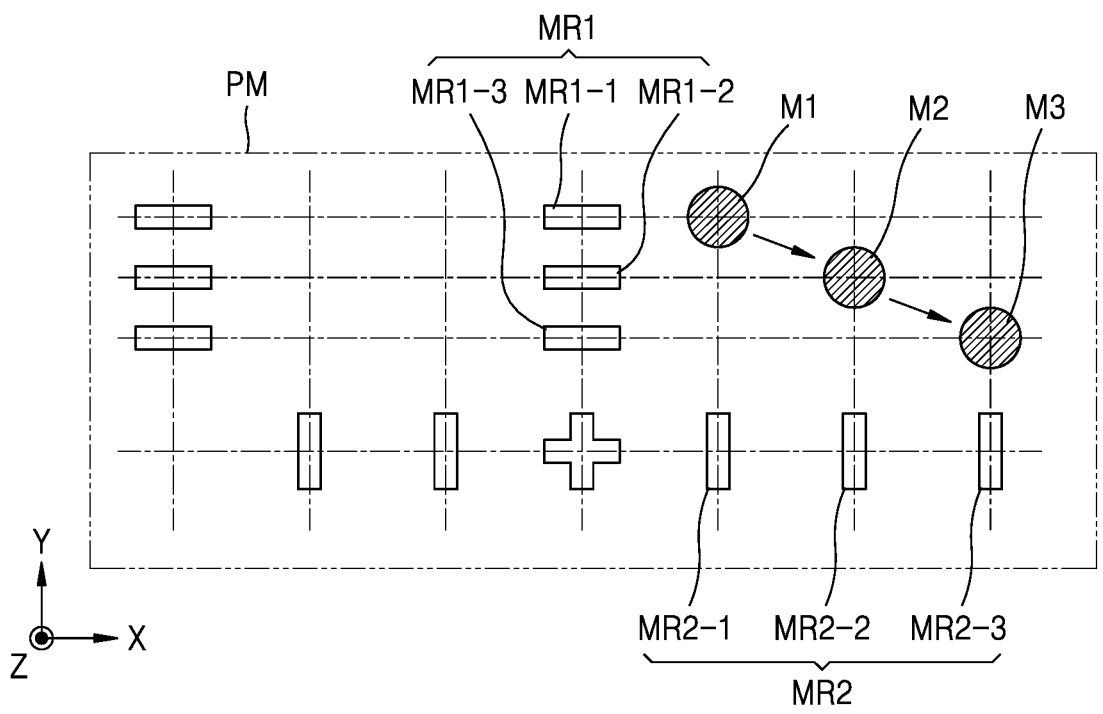
FIG. 9 is a plan view of a deposition confirmation portion of a process substrate, according to another embodiment.
Figure 10:
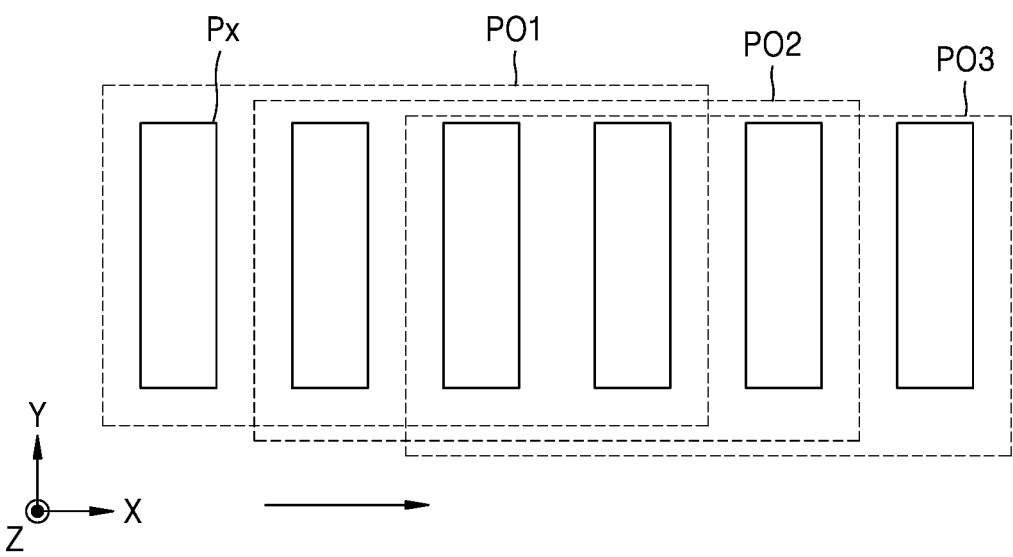
FIG. 10 is a plan view illustrating a deposition method according to another embodiment.

FIG. 9 is a plan view of a deposition confirmation portion PM of a process substrate, according to another embodiment. FIG. 10 is a plan view illustrating a deposition method according to another embodiment.

Referring to FIGS. 9 and 10, the deposition confirmation portion PM may include a first direction pattern MR1 and a second direction pattern MR2. In this case, because the second direction pattern MR2 is the same as that described above with reference to FIG. 8, a detailed description thereof will be omitted.

The first direction pattern MR1 may include a $(1\text{-}1)^{th}$ direction pattern MR1-1, a $(1\text{-}2)^{th}$ direction pattern MR1-2, and a $(1\text{-}3)^{th}$ direction pattern MR1-3. In this case, the $(1\text{-}1)^{th}$ direction pattern MR1-1, the $(1\text{-}2)^{th}$ direction pattern MR1-2, and the $(1\text{-}3)^{th}$ direction pattern MR1-3 may be apart from each other in a second direction.

When a deposition material is deposited on a process substrate MS by using a mask assembly 130, a deposition material may be deposited on the process substrate MS while shifting the mask assembly 130 or the process substrate MS. Hereinafter, for convenience of description, the case of depositing the deposition material on the process substrate MS while shifting the mask assembly 130 will be described in detail.

When the deposition is performed after the mask assembly 130 and the process substrate MS are aligned with each other, the deposition material passing through the confirmation hole 131A is deposited on the deposition confirmation portion PM to form a first deposition material pattern M1 at a first point at which an extension line of the $(1\text{-}1)^{th}$ direction pattern MR1-1 and an extension line of the $(2\text{-}1)^{th}$ direction pattern MR2-1 intersect with each other. At this time, the pattern hole 132A may be arranged at a first position PO1. In this case, the pattern holes 132A may be arranged to correspond to four pixels Px arranged in the first to third areas A1 to A3 on the left side of FIG. 3 in one pixel group.

When the deposition is performed after the mask assembly 130 is shifted, the deposition material passing through the confirmation hole 131A is deposited on the deposition confirmation portion PM to form a second deposition material pattern M2 at a second point at which an extension line of the $(1\text{-}2)^{th}$ direction pattern MR1-2 and an extension line of the $(2\text{-}2)^{th}$ direction pattern MR2-2 intersect with each other. In this case, the pattern hole 132A may be arranged at a second position PO2. At this time, the pattern holes 132A may be arranged to correspond to pixels Px arranged in the second area A2 and the third area A3 on the left side of FIG. 3 and the second area A2 on the right side of FIG. 3 in one pixel group.

When the deposition is performed after the mask assembly 130 is shifted again, the deposition material passing through the confirmation hole 131A is deposited on the deposition confirmation portion PM to form a third deposition material pattern M3 at a third point at which an extension line of the $(1\text{-}3)^{th}$ direction pattern MR1-3 and an extension line of the $(2\text{-}3)^{th}$ direction pattern MR2-3 intersect with each other. At this time, the pattern hole 132A may be arranged at a second position PO2. In this case, the pattern holes 132A may be arranged to correspond to pixels Px arranged in two third areas A3 in FIG. 3, the second area A2 on the right side of FIG. 3, and the first area A1 on the right side of FIG. 3 in one pixel group.

When the deposition is performed as described above, the mask assembly 130 may be shifted in the first direction and the second direction. That is, the mask assembly 130 may be shifted in a direction shifting from the first deposition material pattern M1 to the second deposition material pattern M2. Also, the mask assembly 130 may be shifted in a direction shifting from the second deposition material pattern M2 to the third deposition material pattern M3.

When the mask assembly 130 is shifted as described above, the pattern hole 132A may not deviate from the range of pixels disposed in each area. That is, the mask assembly 130 may be shifted so that the plane of the opening of the pixel defining layer arranged in each pixel is completely inside the pattern hole 132A in a plan view.

When the mask assembly 130 is shifted as described above, the mask assembly 130 may not be shifted only in the first direction, but may be shifted in the second direction while shifted in the first direction. In this case, as illustrated in FIG. 9, the first deposition material pattern M1, the second deposition material pattern M2, and the third deposition material pattern M3 may not be shifted in the first direction or the second direction, but may be shifted in a direction inclined with respect to the first direction and the second direction. Also, in this case, when the pattern holes 132A are arranged at the first position PO1, the second position PO2, and the third position PO3, respectively, line segments connecting the centers of the pattern holes 132A at the respective positions and line segments connecting the centers of the pixels Px may be parallel to each other, or may not form a right angle. That is, the line segments connecting the centers of the pixels Px may be parallel to the first direction or the second direction, and an arbitrary straight line in which the center of the pattern hole 132A is shifted may be arranged diagonally with respect to the first direction or the second direction. In this case, the center of a first lower auxiliary layer 28B-1A formed when the pattern hole 132A is arranged at the first position PO1, the center of a second lower auxiliary layer 28B-1B formed when the pattern hole 132A is arranged at the second position PO2, and the center of a third lower auxiliary layer 28B-1C formed when the pattern hole 132A is arranged at the third position PO3 may be different from each other so as to correspond to the positions of the centers of the pattern holes 132A.

Therefore, the mask assembly 130 or the process substrate MS may be precisely shifted so that the auxiliary layer is accurately arranged on each pixel when the auxiliary layer is formed. Also, the thickness of the intermediate layer of each pixel may be precisely controlled by accurately overlapping at least two auxiliary layers in the pixel.

Figure 11A:
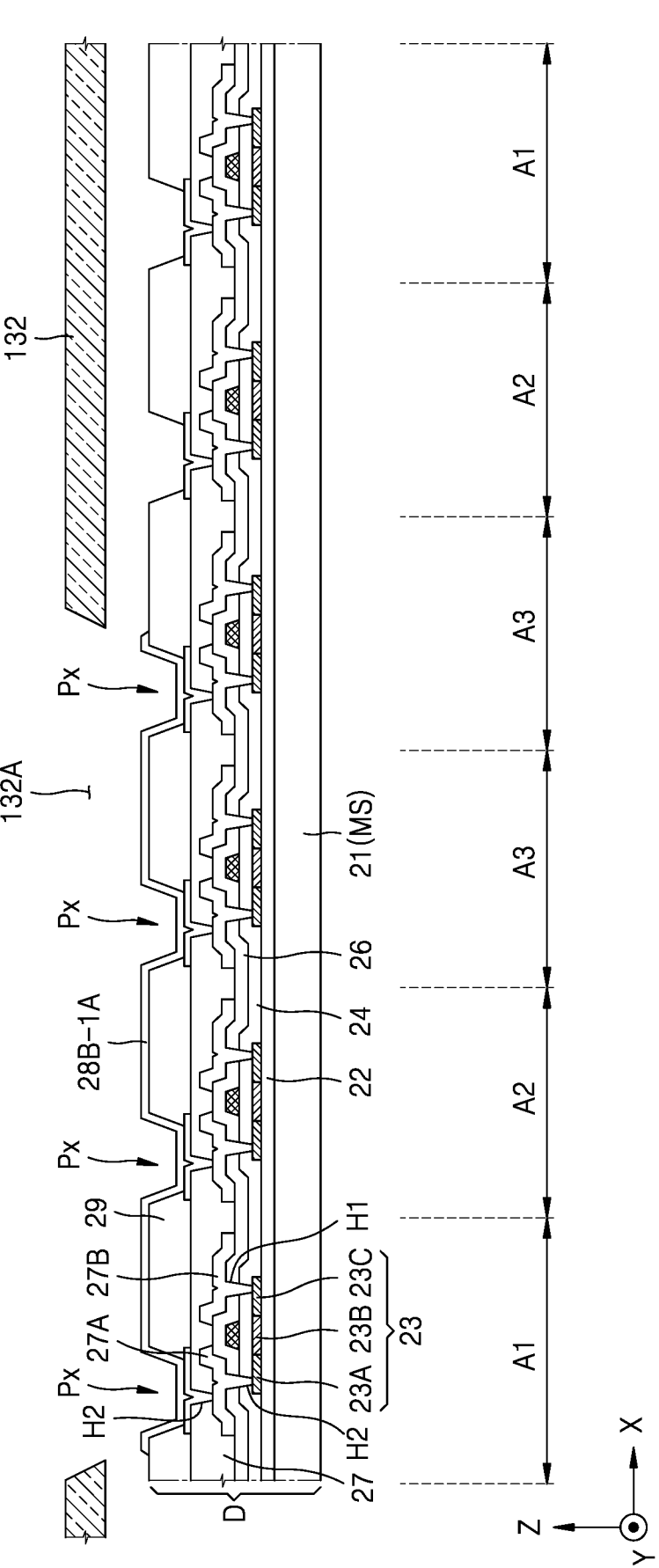
FIGS. 11A, 11B, and 11C are cross-sectional views illustrating a procedure of depositing a deposition material on a process substrate according to the deposition method illustrated in FIG. 8 or 10.
Figure 11B:
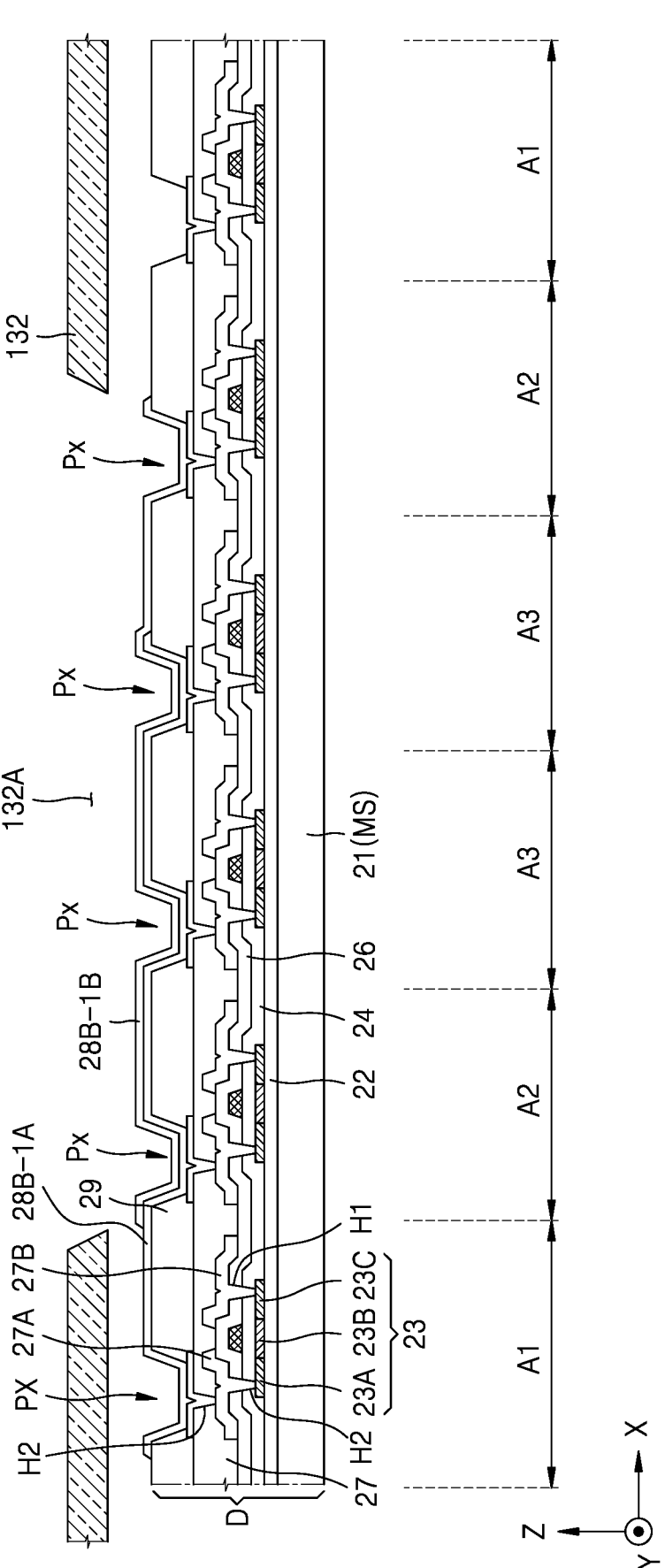
Figure 11C:
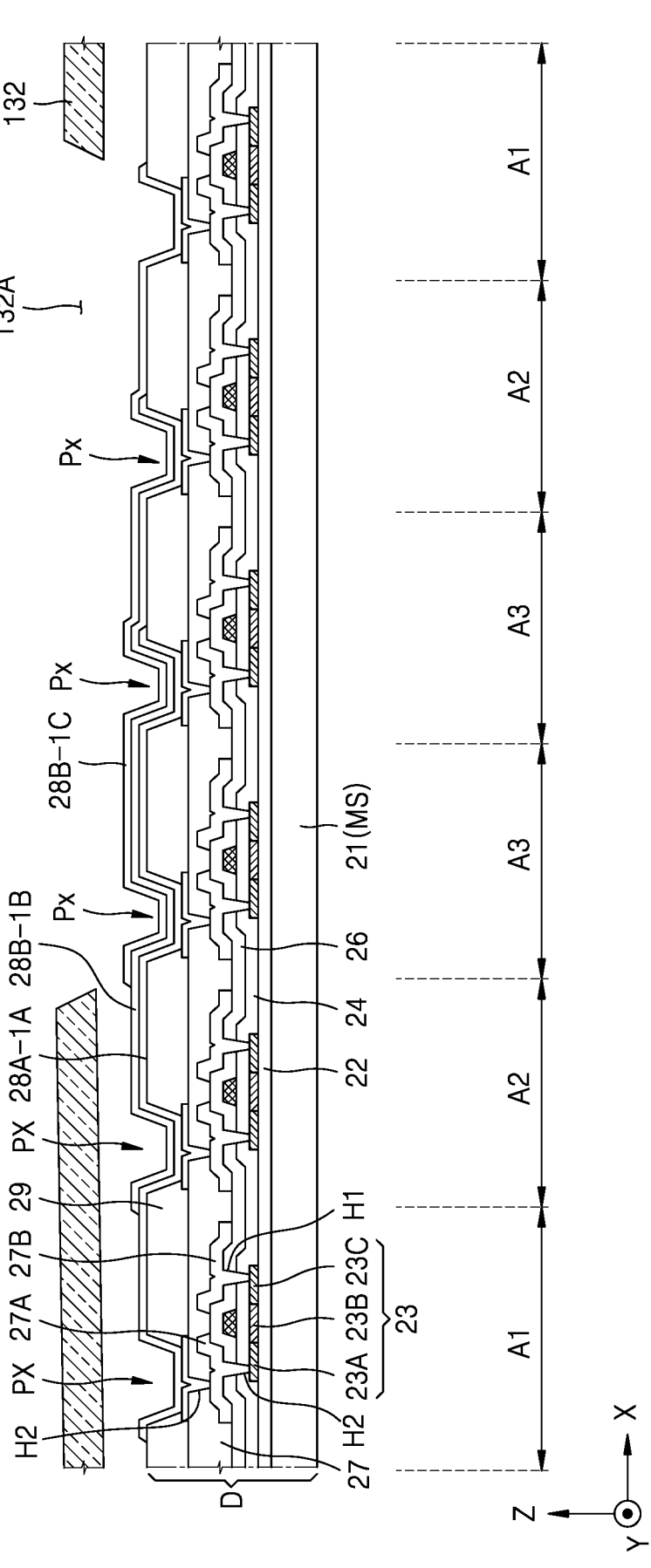

FIGS. 11A to 11C are cross-sectional views illustrating a procedure of depositing a deposition material on a process substrate according to the deposition method illustrated in FIG. 8 or 10.

Referring to FIG. 11A, a first lower auxiliary layer 28B-1A may be formed on a display substrate D. The display substrate D may include a substrate 21, each layer between the substrate 21 and a pixel defining layer 29, the pixel defining layer 29, and a pixel electrode 28A.

In this case, after the display substrate D is arranged in the apparatus 100 for manufacturing the light-emitting device, illustrated in FIG. 4, a deposition material may be deposited on the display substrate D. At this time, one or more display substrates D may be provided on a process substrate MS. That is, the display substrate D may refer to the process substrate MS itself or a portion of the process substrate MS. In particular, when the display substrate D is a portion of the process substrate MS, the display substrate D may include a deposition area of the process substrate MS.

After the mask assembly (not illustrated) is arranged to face the display substrate D, a deposition material may be supplied to the display substrate D through a deposition source (not illustrated).

A deposition material may be deposited on the display substrate D through a pattern hole 132A of a mask sheet 132. In this case, the deposition material may be deposited on the display substrate D arranged in one first area A1, one second area A2, and two third areas A3, which are included in one pixel group. When the deposition material is deposited as described above, the deposition material may be deposited only on some pixels included in one pixel group.

Referring to FIG. 11B, as illustrated in FIG. 11A, a second lower auxiliary layer 28B-1B may be formed on the first lower auxiliary layer 28B-1A. In this case, the second lower auxiliary layer 28B-1B may not be arranged on the entire surface of the first lower auxiliary layer 28B-1A. That is, as illustrated in FIGS. 8 and 10, the second lower auxiliary layer 28B-1B may be arranged to partially overlap the first lower auxiliary layer 28B-1A in a plan view.

In order to form the second lower auxiliary layer 28B-1B as described above, the mask frame may be shifted in the first direction by a certain interval. In this case, the degree of shifting of the mask frame may be an N multiple of the width of at least one pixel in the first direction. (N is a natural number). However, for convenience of description, the case of shifting the mask frame by the width of one pixel in the first direction will be described in detail.

When the deposition material is deposited on the display substrate D after the mask assembly is shifted as described above, the deposition material may be deposited on the display substrate D of two second areas and two third areas A3, except for the left first area A1 and the right first area A1 of FIG. 11B. In this case, in the pixels arranged in the right second area A2 and the two third areas A3, the second lower auxiliary layer 28B-1B may be arranged on the first lower auxiliary layer 28B-1A.

Referring to FIG. 11C, after the second lower auxiliary layer 28B-1B is formed as described above, a third lower auxiliary layer 28B-1C may be formed on the second lower auxiliary layer 28B-1B. In this case, the mask assembly may be shifted again in the first direction from the position of FIG. 11B.

In this case, the pattern holes 132A may be arranged to correspond to two third areas A3, the right second area A2, and the right first area A1.

When the mask assembly is arranged as described above, a deposition material may be supplied from a deposition source. In this case, the deposition material is blocked by the mask sheet 132 in the first area A1 and the second area A2 arranged on the left side, and the deposition material that has passed through the pattern hole 132A may reach the two third areas A3, the right second area A2, and the right first area A1 and may be deposited on the display substrate D.

When the third lower auxiliary layer 28B-1C is formed as described above, the first lower auxiliary layer 28B-1A, the second lower auxiliary layer 28B-1B, and the third lower auxiliary layer 28B-1C may be sequentially formed on the pixel electrode 28A in the two third areas A3. Also, the second lower auxiliary layer 28B-1B and the third lower auxiliary layer 28B-1C may be sequentially arranged on the pixel electrode 28A in the right second area A2, and the third lower auxiliary layer 28B-1C may be arranged on the pixel electrode 28A in the right third area A3.

The above process may not be limited to the above. For example, the deposition material may be deposited on the display substrate D by shifting the mask assembly by 2N times the width of the pixel, instead of shifting the mask assembly as described above. In another embodiment, the number of pixels corresponding to the pattern holes 132A may be less than or greater than the number of pixels illustrated in FIGS. 11A and 11B. At this time, the number of pixels corresponding to the pattern holes 132A may be two or more. In this case, the shifting distance of the mask assembly may be variously adjusted. For example, the shifting distance of the mask assembly may be adjusted to N times or 2N times the width of the pixel.

When the deposition material is deposited on the display substrate D while shifting the mask assembly as described above, the same deposition material may be deposited on each pixel of the display substrate D with different thicknesses. In particular, as described above, when the deposition material is the auxiliary layer, the thicknesses of the intermediate layers 28B of the respective pixels are different from each other. Therefore, pieces of light having different wavelengths may be emitted within the same light-emitting portion (not illustrated).

Figure 12:
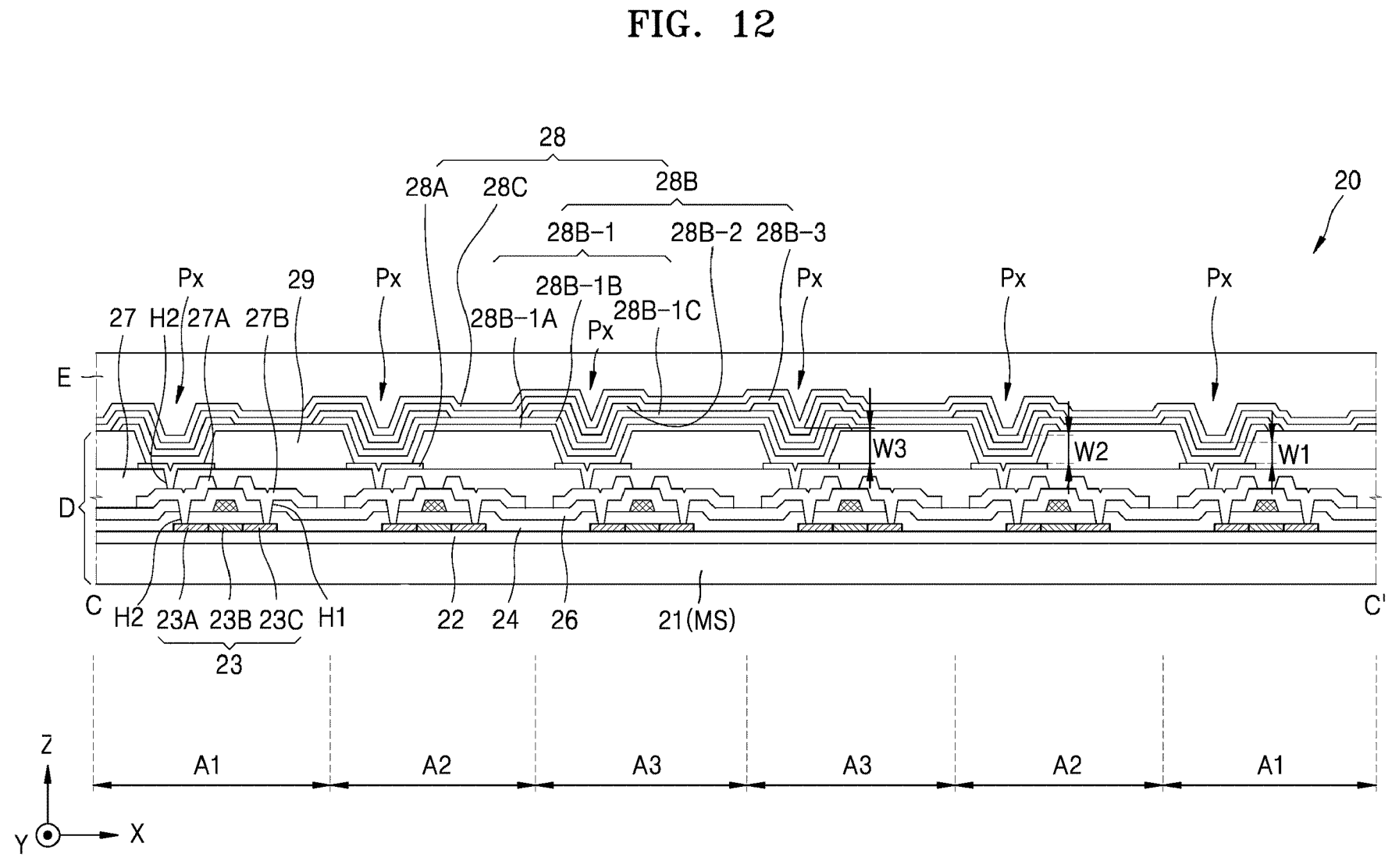

FIG. 12 is a cross-sectional view of a portion of a light-emitting portion 20 of a light-emitting device, according to another embodiment.

Referring to FIG. 12, the light-emitting portion 20 may include a substrate 21, a buffer layer 22, an active layer 23, a gate insulating layer 24, an interlayer insulating layer 26, a source electrode 27A, a drain electrode. 27B, a passivation layer 27, an OLED 28, a pixel defining layer 29, and a thin-film encapsulation layer E. Because the buffer layer 22, the active layer 23, the gate insulating layer 24, the interlayer insulating layer 26, the source electrode 27A, the drain electrode. 27B, the passivation layer 27, the pixel defining layer 29, and the thin-film encapsulation layer E are identical or similar to those described above with reference to FIG. 3, detailed descriptions thereof will be omitted.

The OLED 28 may include a pixel electrode 28A, an intermediate layer 28B, and an opposite electrode 28C. At this time, because the pixel electrode 28A and the opposite electrode 28C are identical or similar to those described above with reference to FIG. 3, detailed descriptions thereof will be omitted.

The intermediate layer 28B may include an organic emission layer 28B-2 and an auxiliary layer. In this case, the auxiliary layer may include a lower auxiliary layer 28B-1 and/or an upper auxiliary layer 28B-3. However, for convenience of description, a case in which the auxiliary layer includes the lower auxiliary layer 28B-1 and the upper auxiliary layer 28B-3 will be described in detail.

The lower auxiliary layer 28B-1 may include a first lower auxiliary layer 28B-1A, a second lower auxiliary layer 28B-1B, and a third lower auxiliary layer 28B-1C. In this case, the first lower auxiliary layer 28B-1A, the second lower auxiliary layer 28B-1B, and the third lower auxiliary layer 28B-1C may be identical or similar to those described above with reference to FIG. 3.

The organic emission layer 28B-2 may be arranged to correspond to a pixel arranged in each area. That is, a plurality of organic emission layers 28B-2 may be provided to be apart from each other. In this case, the organic emission layers 28B-2 may be arranged to correspond to pixels Px, respectively. In this case, the organic emission layers 28B-2 may be spaced apart from each other on one surface of the display substrate D and may be arranged in a certain pattern.

The upper auxiliary layer 28B-3 may be arranged on the organic emission layer 28B-2. In this case, the upper auxiliary layers 28B-3 may be integrally formed with each other and may be arranged on all pixels Px. The upper auxiliary layer 28B-3 may include an electron injection layer and/or an electron transport layer.

In this case, the thickness of the intermediate layer 28B of each pixel Px may be adjusted by adjusting the thickness of the lower auxiliary layer 28B-1 arranged on each pixel Px. Because the method of adjusting the thickness of the lower auxiliary layer 28B-1 is identical or similar to that described above with reference to FIGS. 3 to 11C, a detailed description thereof will be omitted.

Therefore, the light-emitting portion 20 may emit pieces of light having different wavelengths to the outside while emitting pieces of light having the same color.

The light-emitting portion 20 may operate in various ways. For example, the light-emitting portion 20 may cause a pixel arranged in at least one of a first area A1, a second area A2, and a third area A3, arranged in one pixel group, to emit light.

Specifically, the light-emitting portion 20 may cause a pixel Px arranged only in the first area A1, the second area A2, or the third area A3 to emit light, thereby emitting light having one wavelength to the outside.

In another embodiment, the light-emitting portion 20 may cause pixels Px arranged in at least two of the first area A1, the second area A2, and the third area A3 to emit light, thereby emitting pieces of light having at least two wavelengths.

In another embodiment, the light-emitting portion 20 may cause pixels Px arranged in the first area A1, the second area A2, and the third area A3 to emit light according to time, thereby emitting pieces of light having different wavelengths at different times.

Therefore, because the light-emitting portion 20 may freely emit pieces of light having various wavelengths, pieces of light having various effects may be provided to a user.

The case in which the light-emitting portion 20 includes the thin-film encapsulation layer E has been described above, but embodiments of the disclosure are not limited thereto. That is, the light-emitting portion 20 may include a separate encapsulation substrate facing the substrate 21, and a sealing portion arranged between the substrate 21 and the separate encapsulation substrate to attach the substrate 21 to the encapsulation substrate to thereby block the OLED 28 from the outside.

Figure 13:
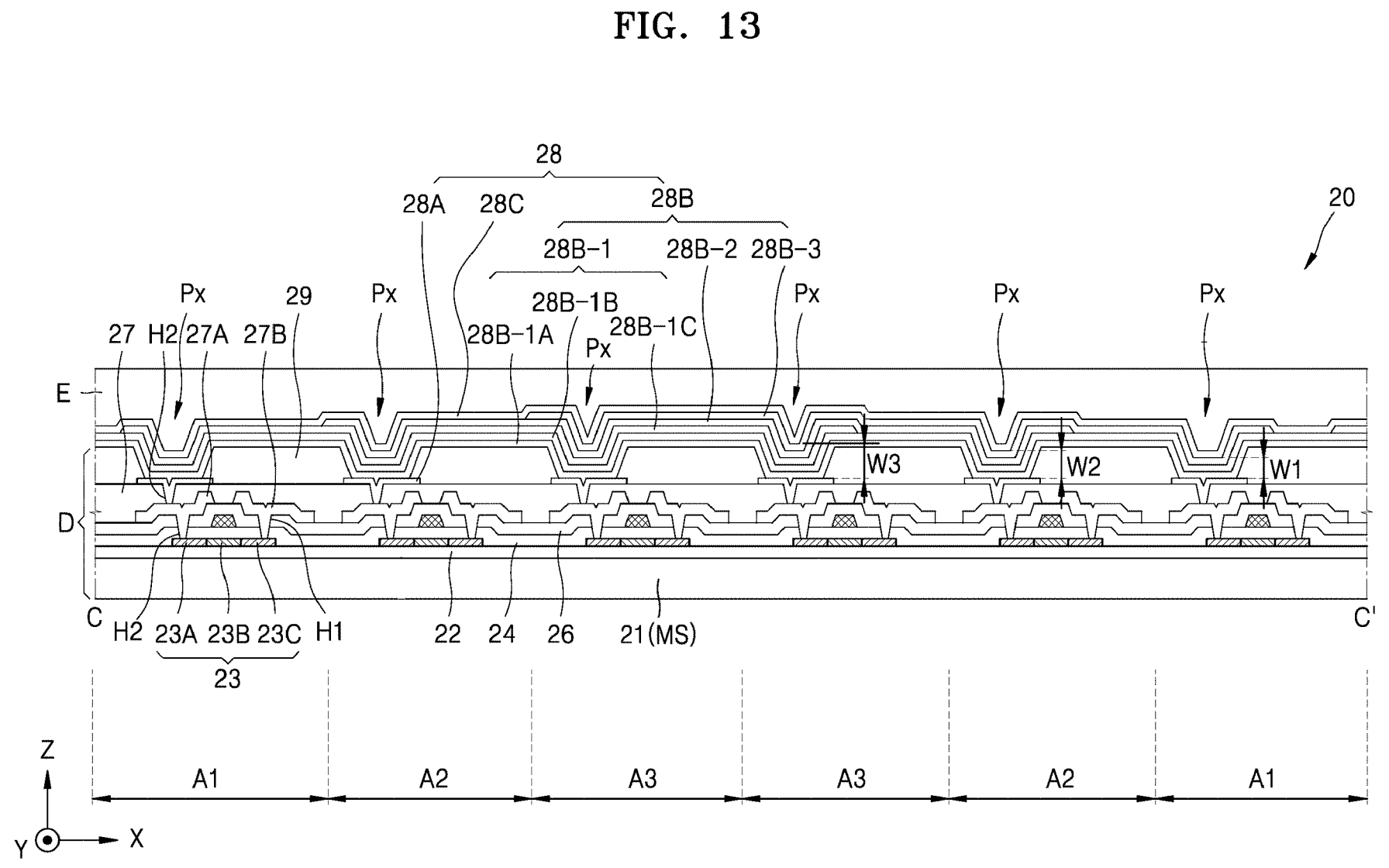

FIG. 13 is a cross-sectional view of a portion of a light-emitting portion 20 of a light-emitting device, according to another embodiment.

Referring to FIG. 13, the light-emitting portion 20 may include a substrate 21, a buffer layer 22, an active layer 23, a gate insulating layer 24, an interlayer insulating layer 26, a source electrode 27A, a drain electrode. 27B, a passivation layer 27, an OLED 28, a pixel defining layer 29, and a thin-film encapsulation layer E. Because the buffer layer 22, the active layer 23, the gate insulating layer 24, the interlayer insulating layer 26, the source electrode 27A, the drain electrode. 27B, the passivation layer 27, the pixel defining layer 29, and the thin-film encapsulation layer E are identical or similar to those described above with reference to FIG. 3, detailed descriptions thereof will be omitted.

The OLED 28 may include a pixel electrode 28A, an intermediate layer 28B, and an opposite electrode 28C. At this time, because the pixel electrode 28A and the opposite electrode 28C are identical or similar to those described above with reference to FIG. 3, detailed descriptions thereof will be omitted.

The intermediate layer 28B may include an organic emission layer 28B-2 and an auxiliary layer. In this case, the auxiliary layer may include a lower auxiliary layer 28B-1 and/or an upper auxiliary layer 28B-3. However, for convenience of description, a case in which the auxiliary layer includes the lower auxiliary layer 28B-1 and the upper auxiliary layer 28B-3 will be described in detail.

The lower auxiliary layer 28B-1 may be arranged on all pixels Px. In this case, the lower auxiliary layer 28B-1 may include a hole injection layer and/or a hole transport layer. When the lower auxiliary layer 28B-1 includes both the hole injection layer and the hole transport layer, the hole injection layer and the hole transport layer may be sequentially stacked on the pixel electrode 28A and the pixel defining layer 29. In this case, the hole injection layer and the hole transport layer may be shared by all the pixels Px. Hereinafter, for convenience of description, a case in which the lower auxiliary layer 28B-1 is the hole transport layer will be described in detail.

The organic emission layer 28B-2 may be arranged on the lower auxiliary layer 28B-1. In this case, as illustrated in FIG. 3, the organic emission layers 28B-2 may be integrally arranged on all the pixels Px. In another embodiment, as illustrated in FIG. 12, the organic emission layers 28B-2 may be apart from each other to correspond to each pixel Px. However, for convenience of description, a case in which the organic emission layers 28B-2 are integrally formed with each other so as to be shared by all the pixels Px will be described in detail.

The upper auxiliary layer 28B-3 may be arranged on the organic emission layer 28B-2. The upper auxiliary layer 28B-3 may include a first upper auxiliary layer 28B-3A, a second upper auxiliary layer 28B-3B, and a third upper auxiliary layer 28B-3C. In this case, each of the first upper auxiliary layer 28B-3A, the second upper auxiliary layer 28B-3B, and the third upper auxiliary layer 28B-3C may include an electron injection layer and/or an electron transport layer. In particular, the first upper auxiliary layer 28B-3A, the second upper auxiliary layer 28B-3B, and the third upper auxiliary layer 28B-3C may include the same material or different materials.

The first upper auxiliary layer 28B-3A, the second upper auxiliary layer 28B-3B, and the third upper auxiliary layer 28B-3C may be differently stacked on the pixels Px arranged in each area. For example, in the case of the pixel Px arranged in the first area A1 on the left side of FIG. 13, only the first upper auxiliary layer 28B-3A may be arranged on the organic emission layer 28B-2. In the case of the pixel Px arranged in the second area A2 on the left side of FIG. 13, the first upper auxiliary layer 28B-3A and the second upper auxiliary layer 28B-3B may be sequentially stacked on the organic emission layer 28B-2. In each of the pixels Px arranged in the two third areas A3 in the center of FIG. 13, the first upper auxiliary layer 28B-3A, the second upper auxiliary layer 28B-3B, and the third upper auxiliary layer 28B-3C may be sequentially stacked on the organic emission layer 28B-2. In the case of the pixel Px arranged in the second area A2 on the left side of FIG. 13, the third upper auxiliary layer 28B-3C may be arranged on the second upper auxiliary layer 28B-3B. In the case of the pixel Px arranged in the first area A1 on the right side of FIG. 13, only the third upper auxiliary layer 28B-3C may be arranged on the organic emission layer 28B-2.

In this case, the thickness of the intermediate layer 28B may be determined according to the number of upper auxiliary layers 28B-3 arranged on the organic emission layer 28B-2. That is, when the number of upper auxiliary layers 28B-3 arranged on the organic emission layer 28B-2 of each pixel Px is greater than the number of upper auxiliary layers 28B-3 arranged on the organic emission layer 28B-2 of another pixel Px, the thickness of the intermediate layer 28B of the pixel Px having a large number of upper auxiliary layers 28B-3 may be greater than the thickness of the intermediate layer 28B of the other pixel Px.

The arrangement and number of the upper auxiliary layers 28B-3 may be similar to the arrangement and number of the lower auxiliary layers 28B-1 described above with reference to FIGS. 3 to 12. That is, the first upper auxiliary layer 28B-3A and the second upper auxiliary layer 28B-3B may not completely overlap each other in a plan view, and the second upper auxiliary layer 28B-3B and the third upper auxiliary layer 28B-3C may not completely overlap each other in a plane.

Because at least two pixels Px in which the thicknesses of the intermediate layers 28B are different are present, the light-emitting portion 20 may emit pieces of light having different wavelengths to the outside while emitting pieces of light having the same color.

The light-emitting portion 20 may operate in various ways. For example, the light-emitting portion 20 may cause a pixel arranged in at least one of the first area A1, the second area A2, and the third area A3, arranged in one pixel group, to emit light.

Specifically, the light-emitting portion 20 causes a pixel Px arranged only in the first area A1, the second area A2, or the third area A3 to emit light, thereby emitting light having one wavelength to the outside.

In another embodiment, the light-emitting portion 20 may cause pixels Px arranged in at least two of the first area A1, the second area A2, and the third area A3 to emit light, thereby emitting pieces of light having at least two wavelengths.

In another embodiment, the light-emitting portion 20 may cause pixels Px arranged in the first area A1, the second area A2, and the third area A3 to emit light according to time, thereby emitting pieces of light having different wavelengths at different times.

Therefore, because the light-emitting portion 20 may freely emit pieces of light having various wavelengths, pieces of light having various effects may be provided to a user.

The case in which the light-emitting portion 20 includes the thin-film encapsulation layer E has been described above, but embodiments of the disclosure are not limited thereto. That is, the light-emitting portion 20 may include a separate encapsulation substrate facing the substrate 21, and a sealing portion arranged between the substrate 21 and the separate encapsulation substrate to attach the substrate 21 to the encapsulation substrate to thereby block the OLED 28 from the outside.

The light-emitting device according to one or more embodiments may supply pieces of light having different wavelengths to the outside. Also, the light-emitting devices may supply light having a certain wavelength to the outside.

According to the method of manufacturing the light-emitting device, according to one or more embodiments, the light-emitting device including the pixels having the intermediate layers with different thicknesses may be manufactured.

According to the method of manufacturing the light-emitting device, according to one or more embodiments, the pixels having the intermediate layers with different thicknesses may be manufactured in the single manufacturing apparatus without replacing the mask assembly for each pixel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a light-emitting device, the method comprising:

assembling a mask assembly to comprise:

a mask frame; and a plurality of mask sheets arranged on the mask frame in a first direction or a second direction with each mask sheet defining a plurality of pattern holes separated from one another in the first direction and the second direction;

arranging a process substrate and the mask assembly in a chamber;

depositing a deposition material by supplying the deposition material from a deposition source to the process substrate through the plurality of pattern holes of each of the plurality of mask sheets of the mask assembly;

shifting the process substrate or the mask assembly in the first direction; and depositing a deposition material by supplying the deposition material from the deposition source to the process substrate through the plurality of pattern holes of each of the plurality of mask sheets of the mask assembly.

2. The method of claim 1, further comprising:

depositing the deposition material through a confirmation hole of the mask assembly to form deposition confirmation portions; and shifting the process substrate or the mask assembly in the first direction to form one or more first direction patterns on the process substrate and in the second direction to form one or more second direction patterns, which are perpendicular with respect to the one or more first direction patterns, on the process substrate, wherein one or more lines extending from each of the one or more first direction patterns to each of the deposition confirmation portions visibly intersects with one or more lines extending from each of the second direction patterns to each of the deposition confirmation portions for accuracy confirmation.

3. The method of claim 2, wherein the first direction and the second direction are perpendicular to each other.

4. The method of claim 1, wherein:

the plurality of pattern holes of each of the plurality of sheet masks are arranged in rows across each of the plurality of sheet masks, and the plurality of pattern holes of each of the plurality of sheet masks is formed to guide the deposition material to at least two pixels arranged in a deposition area of the process substrate.

5. The method of claim 1, wherein the deposition material is deposited on the process substrate to form an auxiliary layer.

6. The method of claim 1, further comprising depositing the deposition material in a deposition confirmation area of the process substrate.

7. The method of claim 6, wherein the deposition confirmation area is between adjacent deposition areas of the process substrate.

8. A method of manufacturing a light-emitting device, the method comprising:

assembling a mask assembly to comprise:

a mask frame; and a plurality of mask sheets arranged on the mask frame in a first direction or a second direction with each mask sheet defining a plurality of pattern holes separated from one another in the first direction and the second direction;

depositing a deposition material through the plurality of pattern holes of the plurality of masks on a first area of a process substrate; and depositing a deposition material through the plurality of pattern holes of the plurality of masks on a second area of the process substrate, wherein at least a portion of the first area overlaps at least a portion of the second area.

9. The method of claim 8, wherein:

at least two pixels are arranged in each of the first area and the second area; and a thickness of the deposition material in the pixel arranged only in the first area or the second area is different from a thickness of the deposition material in the pixel arranged in an area in which the first area overlaps the second area.

10. A method of manufacturing a light-emitting device, the method comprising:

depositing a deposition material through the plurality of pattern holes of the plurality of masks on a first area of a process substrate; and depositing a deposition material through the plurality of pattern holes of the plurality of masks on a second area of the process substrate, wherein:

at least a portion of the first area overlaps at least a portion of the second area, at least two pixels are arranged in each of the first area and the second area, and a thickness of the deposition material in the pixel arranged only in the first area or the second area is different from a thickness of the deposition material in the pixel arranged in an area in which the first area overlaps the second area.

* * * * *